(12) United States Patent
Yoshikawa et al.

(10) Patent No.: US 8,080,846 B2
(45) Date of Patent: Dec. 20, 2011

(54) SEMICONDUCTOR DEVICE HAVING IMPROVED BREAKDOWN VOLTAGE AND METHOD OF MANUFACTURING THE SAME

(75) Inventors: Koh Yoshikawa, Matsumoto (JP); Setsuko Wakimoto, Matsumoto (JP); Hitoshi Kuribayashi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 991 days.

(21) Appl. No.: 11/763,625

(22) Filed: Jun. 15, 2007

(65) Prior Publication Data
US 2007/0290267 A1    Dec. 20, 2007

(30) Foreign Application Priority Data

Jun. 15, 2006   (JP) ................................ 2006-166177

(51) Int. Cl.
  *H01L 29/76*   (2006.01)
  *H01L 29/94*   (2006.01)
(52) U.S. Cl. .......................... 257/341; 257/329; 257/409
(58) Field of Classification Search .................. 257/168, 257/170, 171, 329, 330, 339, 365, 409, E29.016, 257/E29.026, E29.027
See application file for complete search history.

(56) References Cited

U.S. PATENT DOCUMENTS

| | | | |
|---|---|---|---|
| 4,904,609 A | 2/1990 | Temple | |
| 4,999,684 A | 3/1991 | Temple | |
| 6,849,900 B2 | 2/2005 | Aida et al. | |
| 2002/0027237 A1 | 3/2002 | Onishi et al. | |
| 2002/0074596 A1 | 6/2002 | Suzuki et al. | |
| 2004/0016959 A1 | 1/2004 | Yamaguchi et al. | |
| 2004/0026735 A1 | 2/2004 | Suzuki et al. | |
| 2004/0206989 A1 | 10/2004 | Aida et al. | |
| 2005/0184336 A1* | 8/2005 | Takahashi et al. | ............ 257/328 |

FOREIGN PATENT DOCUMENTS

| | | |
|---|---|---|
| JP | 2-22869 A | 1/1990 |
| JP | 10-270686 A | 10/1998 |
| JP | 2000-260984 A | 9/2000 |
| JP | 2001-015752 A | 1/2001 |
| JP | 2001-185727 A | 7/2001 |
| JP | 2001-244461 A | 9/2001 |
| JP | 2002-076339 A | 3/2002 |
| JP | 2002-184985 A | 6/2002 |
| JP | 2003-115589 A | 4/2003 |
| JP | 2003-124464 A | 4/2003 |
| JP | 2004-200441 A | 7/2004 |
| JP | 2004-319732 A | 11/2004 |

* cited by examiner

*Primary Examiner* — Hung Vu
(74) *Attorney, Agent, or Firm* — Rossi, Kimms & McDowell LLP

(57) ABSTRACT

A semiconductor device is disclosed which improves the breakdown voltage of a planar-type junction edge terminating structure. The device includes an n-type semiconductor substrate layer common to an active section and an edge terminating section. An n-type drift region is formed selectively on the n-type semiconductor substrate layer in the active section and a p-type partition region is formed selectively on the n-type semiconductor substrate layer in the active section. A p-type base/body region is formed on the n-type drift region and the partition region. A source electrode is connected electrically to the p-type base/body region. A p-type partition region is formed in the edge terminating section between the p-type base/body region and the scribe plane of the semiconductor device such that the p-type partition region in the edge terminating section surrounds the p-type base/body region. A drain electrode is connected electrically to the n-type semiconductor substrate layer.

19 Claims, 34 Drawing Sheets

PROJECTION LENGTH OF P-TYPE BASE/BODY REGION

IMPURITY CONCENTRATION IN P-TYPE PARTITION REGION

SEMICONDUCTOR DEVICE HAVING IMPROVED BREAKDOWN VOLTAGE AND METHOD OF MANUFACTURING THE SAME

CROSS REFERENCE TO RELATED APPLICATIONS

This application claims priority from Japanese application Serial No. JP 2006-166177, filed on Jun. 15, 2006.

BACKGROUND OF THE INVENTION

A. Field of the Invention

The present invention relates to semiconductor devices and the method of manufacturing the semiconductor devices. Specifically, the invention relates to power semiconductor devices such as a diode, an insulated gate field effect transistor having a metal-insulator-semiconductor structure (hereinafter referred to as a "MISFET"), and an insulated gate bipolar transistor (hereinafter referred to as an "IGBT") which include a specific edge terminating structure disposed therein.

B. Description of the Related Art

Generally, many pieces of a semiconductor device such as a diode, a MISFET, and an IGBT are formed in a semiconductor wafer. Many power semiconductor devices employ a planar-type junction edge terminating structure. Since the section that has the planar-type junction edge terminating structure includes a portion, in which equipotential surfaces curve sharply, electric field localization is caused more easily in the section having the planar-type junction edge terminating structure than on the flat junction in the active section of the semiconductor devices. (Hereinafter, the section having an edge terminating structure will be referred to as the "edge terminating section.")

Once a high-electric-field portion is caused in the edge terminating section, the electric field strength reaches the critical value, which causes breakdown, faster in the edge terminating section than in the active section. Therefore, breakdown is caused at a voltage lower than the designed breakdown voltage. To obviate this problem, a floating guard ring structure, a field plate structure, a reduced-surface-electric-field structure (hereinafter referred to as a "RESURF structure"), and appropriate combinations of these structures are employed for the planar-type junction edge terminating structure to secure the designed breakdown voltage (cf. Publication of Unexamined Japanese Patent Application Hei. 2 (1990)-22869 (Counterpart U.S. Pat. No. 4,904,609, Counterpart U.S. Pat. No. 4,999,684) and Publication of Unexamined Japanese Patent Application 2001-85727).

Super-junction semiconductor devices, which include an alternating conductivity type layer including p-type partition regions and n-type drift regions arranged alternately (hereinafter referred to as a "super-junction layer) and extended into the edge terminating section, have been known to the ordinary skilled person in the art (cf. Publication of Unexamined Japanese Patent Application 2004-319732 (Counterpart U.S. Pat. No. 6,849,900) and Publication of Unexamined Japanese Patent Application 2003-115589). In the semiconductor devices described in these two documents, the super-junction layer in the edge terminating section has a structure that facilitates keeping charge valance between the p-type partition regions and the n-type drift regions. Alternatively, the edge terminating section includes an additional semiconductor layer, the conductivity type thereof is the same with the conductivity type of the drift layer, and any of a floating guard ring structure, a field plate structure, and a RESURF structure formed on the additional semiconductor layer.

A super-junction semiconductor device, which includes an insulator region around the active section including a super-junction layer and sustains the breakdown voltage with the insulator region, has been known to the ordinary skilled person in the art (cf. Publication of Unexamined Japanese Patent Application 2001-244461).

The super-junction semiconductor device is a semiconductor device in which the drift layer is neither uniform nor of one conductivity type but comprised instead of semiconductor regions of a first conductivity type (e.g., n-type drift regions) and semiconductor regions of a second conductivity type (e.g., p-type partition regions) laminated alternately.

However, in many semiconductor devices, the conventional planar-type junction edge terminating structure is formed around the active section and the surface of the edge terminating structure is coplanar with the surface of the active section including a main junction that sustains the breakdown voltage. In this case, an electric field strength rise is caused by the flat pn-junction and a high-electric-field portion is caused by the electric field localization due to the existence of a portion which has a curvature on the junction plane in the edge terminating section. Due to the multiplier effect of the electric field strength rise and the resulting high-electric-field portion, the electric field strength reaches the critical value that causes breakdown faster in the edge terminating section than in the active section, causing a low breakdown voltage. Here, the main junction that sustains the breakdown voltage is a pn-junction, to which a voltage is applied in the reverse direction.

In view of the foregoing, it would be desirable to obviate the problems described above. It would be also desirable to provide a semiconductor device that improves the breakdown voltage of the junction edge terminating structure. It would be further desirable to provide a method of manufacturing the semiconductor device that improves the breakdown voltage of the junction edge terminating structure.

The present invention is directed to overcoming or at least reducing the effects of one or more of the problems set forth above.

SUMMARY OF THE INVENTION

According to the subject matter of the appended claim 1, there is provided a semiconductor device that includes a semiconductor chip and makes a current flow in the thickness direction of the semiconductor chip, the semiconductor device including:

an active section including a base region of a second conductivity type formed selectively on the first major surface side of the semiconductor chip, a semiconductor substrate layer on the second major surface side of the semiconductor chip, and a drift layer between the semiconductor substrate layer and the base region;

a first main electrode connected electrically to the base region;

a pillar region of a first conductivity type formed along the scribe plane of the semiconductor chip;

an edge terminating section surrounding the active section, the edge terminating section including a first semiconductor region of the second conductivity type formed between the active section and the pillar region; and a second main electrode connected electrically to the second major surface side of the semiconductor chip.

The edge terminating section in this semiconductor device preferably includes a second semiconductor region of the first conductivity type added to the first semiconductor region, and the net average impurity concentration obtained by subtracting the average impurity concentration of the second semiconductor region from the average impurity concentration of the first semiconductor region is $2.5 \times 10^{14}$ cm$^{-3}$ or lower.

In a preferred embodiment, the drift layer in the semiconductor device includes a drift region of the first conductivity type or an alternating conductivity type layer including drift regions of the first conductivity type and partition regions of the second conductivity type arranged alternately.

If is preferable if the junction boundary plane between the first semiconductor region and the drift layer slants toward the major surfaces of the first semiconductor region and the drift layer in the semiconductor device.

In one embodiment the semiconductor device further includes an insulator layer between the first semiconductor region and the semiconductor substrate layer.

In another embodiment, the first semiconductor region is in contact with the base region in the semiconductor device.

Preferably the semiconductor device further includes a channel stopper region disposed in the surface portion of the first semiconductor region on the scribe plane side of the semiconductor chip. In a preferred embodiment, the pillar region and the channel stopper region are in contact with each other in the semiconductor device.

The semiconductor device may also include a field plate structure that is in contact with the base region and extending onto an insulator film covering a part of the first semiconductor region.

Preferably the thickness t and the concentration $N_2$ of the first semiconductor region in the semiconductor device are related to each other by the following relational expression using the unit charge q, the dielectric permeability of silicon$\in_{Si}$, and the critical electric field strength $E_{Critical}$ of a semiconductor $$N_2 < \in_{Si} \times E_{Critical}/(q \times t)$$

and more preferably the thickness t and the concentration $N_2$ of the first semiconductor region in the semiconductor device are related to each other by the following relational expression $$N_2 < 0.8 \times \in_{Si} \times E_{Critical}/(q \times t)$$

Preferably the projection length $W_{Projection}$ of the base region projecting to the first semiconductor region is related to the thickness t of the first semiconductor region in the semiconductor device by the following relational expression $$W_{Projection} > 0.2 \times t$$

and more preferably the projection length $W_{Projection}$ of the base region is related to the thickness t of the first semiconductor region by the following relational expression.

$$W_{Projection} > 0.4 \times t$$

In preferred embodiments, the semiconductor device is a diode, a MOSFET, or an IGBT.

A method of manufacturing the semiconductor device includes the steps of:
  etching a semiconductor wafer to form trenches in the semiconductor wafer;
  thermally oxidizing the portions of the semiconductor wafer remaining between the trenches to form oxide films;
  removing the oxide films formed by the thermally oxidizing; and
  filling the portions, from which the oxide films have been removed, with an epitaxial layer of the second conductivity type to form the first semiconductor region.

Another method of manufacturing the semiconductor device includes the steps of:
  etching a semiconductor wafer to form trenches in the semiconductor wafer;
  filling the trenches with an epitaxial layer of the second conductivity type; and
  diffusing an impurity of the second conductivity type between the trenches to form the first semiconductor region.

An alternative method of manufacturing the semiconductor device includes the steps of:
  etching a semiconductor wafer by anisotropic wet etching to form a trench in the semiconductor wafer; and
  filling the trench with an epitaxial layer of the second conductivity type to form the first semiconductor region.

Any of the methods may further include the steps of:
  conducting thermal oxidation after the step of filling with an epitaxial layer; and
  polishing the surface of the semiconductor wafer after the step of conducting thermal oxidation.

The conductivity type (second conductivity type) of the first semiconductor region in the edge terminating section is opposite to the conductivity type (first conductivity type) of the drift layer in the active section but the same as the conductivity type (second conductivity type) of the base region.

The effective conductivity type of the first semiconductor region is the same as the conductivity type of the base region.

Therefore, the main junction that sustains the breakdown voltage of the edge terminating section is neither on the side of the first main electrode nor coplanar with the main junction that sustains the breakdown voltage of the active section. Therefore, the electric field rise is caused on the flat junction plane between the semiconductor substrate layer of the first conductivity type and the first semiconductor region of the second conductivity type.

Preferably, the depletion layer reaches the first major surface from the semiconductor substrate layer in the edge terminating section, and more particularly, the depletion layer surely reaches the first major surface when $N_2 < 0.8 \times \in_{Si} \times E_{Critical}/(q \times t)$.

According to the first two methods of manufacturing the semiconductor device, a thick first semiconductor region of the second conductivity type is formed more easily.

The semiconductor device according to the invention facilitates the prevention of the multiplier effect of the electric field strength rise on the flat junction plane and the formation of a high-electric-field portion caused by electric field localization is prevented from occurring. Since the electric field in the junction edge terminating structure hardly reaches the electric field strength at which breakdown results, the breakdown voltage of the junction edge terminating structure is improved. By the manufacturing method according to the invention, a semiconductor device that includes a planar-type junction edge terminating structure and facilitates improving the breakdown voltage of the junction edge terminating structure is obtained.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1A:
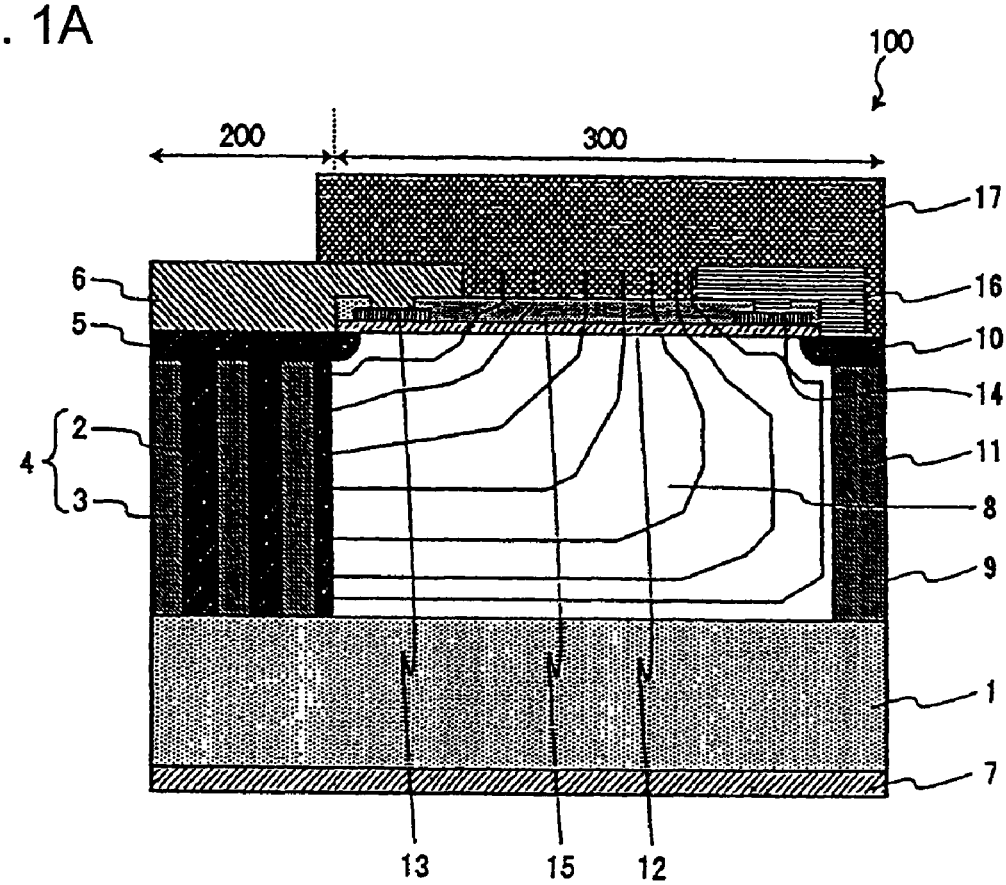
FIG. 1A is a cross sectional view of a semiconductor device according to a first embodiment of the invention.

Now the invention will be described in detail hereinafter with reference to the accompanied drawings which illustrate the preferred embodiments of the invention. In the following descriptions, the n-type layer or the n-type region is a layer or a region in which electrons are majority carriers. The p-type layer or the p-type region is a layer or a region in which holes are majority carriers. The suffix "+" to the right of the letter "n" or "p" indicating the conductivity type of a layer or a region indicates that the layer or the region is doped relatively heavily. The suffix "−" to the right of the letter "n" or "p" indicating the conductivity type of a layer or a region indicates that the layer or the region is doped relatively lightly. In the following descriptions with reference to the accompanying drawings, the same or like part is designated by the like reference numeral and the duplicated description thereof is omitted for the sake of simplicity.

First Embodiment

Semiconductor Device Structure

Figure 1B:
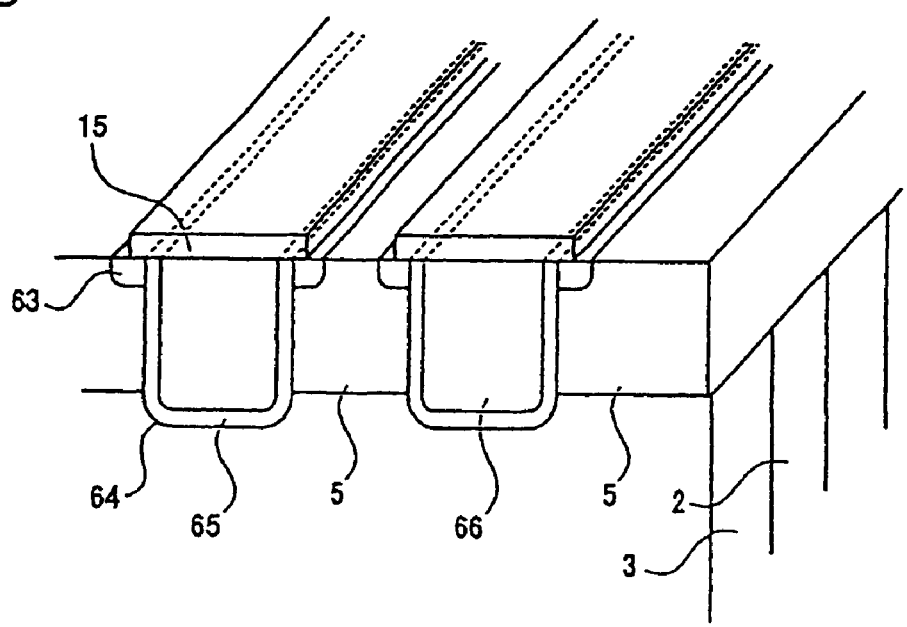
FIG. 1B is a perspective view of the semiconductor device according to the first embodiment.

FIG. 1A is a cross sectional view of a semiconductor device according to a first embodiment of the invention showing edge terminating section 300. FIG. 1B is a perspective view of the semiconductor device according to the first embodiment showing active section 200.

Referring now to these drawings, semiconductor device 100 includes active section 200, in which semiconductor devices such as field effect transistors having a metal-oxide-semiconductor structure (hereinafter referred to as "MOSFETs"), IGBTs and diodes are formed, and edge terminating section 300 that surrounds active section 200. Edge terminating section 300 is arranged on the first major surface side of semiconductor device 100.

Sufficiently heavily doped n-type semiconductor substrate layer 1 is extended on the second major surface side of active section 200 and edge terminating section 300. In active section 200, alternating conductivity type layer (hereinafter referred to as "super-junction layer") 4 including p-type partition regions 2 and n-type drift regions 3 arranged alternately is disposed on semiconductor substrate layer 1.

When semiconductor device 100 is a vertical trench MOSFET, semiconductor device 100 includes, on the first major surface side thereof, p-type base region or p-type body region (hereinafter referred to as "p-type base/body region") 5 formed selectively, source region 63 formed selectively in base/body region 5, trench 64 formed more deeply than base/body region 5, gate electrode 66 formed in trench 64 with gate insulator film 65 interposed between gate electrode 66 and trench 64, interlayer insulator film 15 covering gate electrode 66, and source electrode 6 connected electrically to base/body region 5 and source region 63. Gate insulator film 65 is thinner than oxide film 12 described later. In the perspective view shown in FIG. 1B, source electrode 6 is omitted for the sake of easy understanding.

In semiconductor device 100 according to the first embodiment, gate electrode 66 extends perpendicularly to the extending direction of super-junction layer 4, along which partition regions 2 and drift regions 3 are arranged alternately. By making the extending directions of trenches 64 and super-junction layer 4 cross at right angles as described above, base/body regions 5 and super-junction layer 4 are brought reliably into contact with each. Therefore, the semiconductor regions on the first major surface side of semiconductor device 100 and super-junction layer 4 are positioned easily with reference to each other. Semiconductor substrate layer 1 works for the drain region of the MOSFET. Drain electrode 7 is disposed on the second major surface of semiconductor device 100 and connected electrically to semiconductor substrate layer 1.

In edge terminating section 300, p-type partition region 8 is disposed on n-type semiconductor substrate layer 1. Partition region 8 is in contact with p-type base/body region 5. Between p-type partition region 8 and scribe plane 9 of semiconductor device 100, n-type channel stopper region 10 and n-type pillar region 11 are disposed. Channel stopper region 10 is disposed on the first major surface side of semiconductor device 100. Pillar region 11 is disposed along scribe plane 9 of semiconductor device 100 between channel stopper region 10 and semiconductor substrate layer 1.

The first major surface of p-type partition region 8 between the boundary portion of p-type base/body region 5, disposed in active section 200, in contact with edge terminating section 300 and n-type channel stopper region 10 is covered with oxide film 12 made, for example, of silicon oxide. Field plates 13 and 14 are formed selectively on oxide film 12.

Source electrode 6 is extended from active section 200 to edge terminating section 300 such that source electrode 6 is in contact with field plate 13 arranged on the side of active section 200 via a contact hole opened in interlayer insulator film 15. The field plate structure in edge terminating section 300 is comprised of oxide film 12 that covers p-type partition region 8, field plate 13 arranged on the side of active section 200 and the edge portion of source electrode 6 in contact with field plate 13.

Channel stopper electrode 16 in contact with n-type channel stopper region 10 is brought into contact with field plate 14 arranged on the side of n-type channel stopper region 10 via a contact hole opened in interlayer insulator film 15. Edge terminating section 300 is covered with passivation film 17. In FIG. 1A, equipotential lines (seven polygonal lines) in edge terminating section 300 are described in p-type partition region 8 together with the cross sectional structure of semiconductor device 100.

Figure 2:
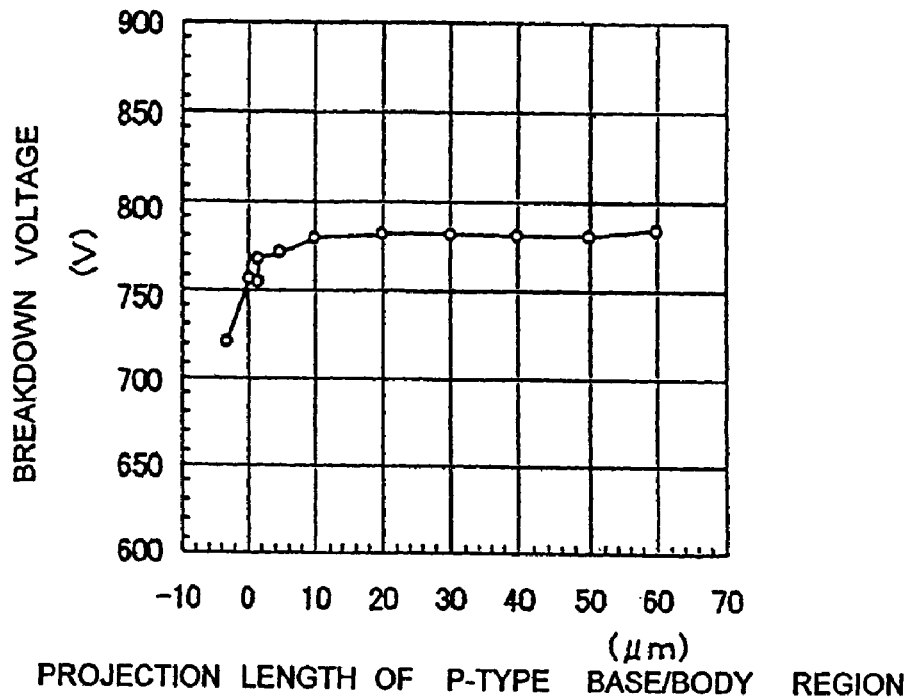
FIG. 2 is a characteristic curve relating the projection length of a p-type base/body region to a p-type partition region in an edge terminating section and the breakdown voltage with each other.

Projection Length of the p-type Base/Body Region to the p-type Partition Region in the Edge Terminating Structure The inventors of the present invention have found that a high breakdown voltage is obtained very stably when p-type partition region 8 in edge terminating section 300 is connected electrically to p-type base/body region 5 and p-type base/body region 5 is designed such that p-type base/body region 5 extends to p-type partition region 8. FIG. 2 describes a characteristic curve relating the projection length of p-type base/body region 5 to p-type partition region 8 and the breakdown voltage with each other for the thickness of p-type partition region 8 set at 50 μm.

As shown in FIG. 2, a high breakdown voltage is obtained stably, when the projection length of p-type base/body region 5 is 10 μm or longer (⅕ of the thickness of p-type partition region 8) and, preferably, 20 μm or longer (⅖ of the thickness of p-type partition region 8). Generally speaking, when the following relational expression (1), which relates the projection length $W_{Projection}$ of p-type base/body region 5 with the thickness t of p-type partition region 8, is satisfied, a high voltage is obtained stably. When the following relational expression (2), which relates the projection length $W_{Projection}$ of p-type base/body region 5 with the thickness t of p-type partition region 8, is satisfied, a high voltage is obtained more stably.

$$W_{Projection} > 0.2 \times t \quad (1)$$

$$W_{Projection} > 0.4 \times t \quad (2)$$

Figure 3:
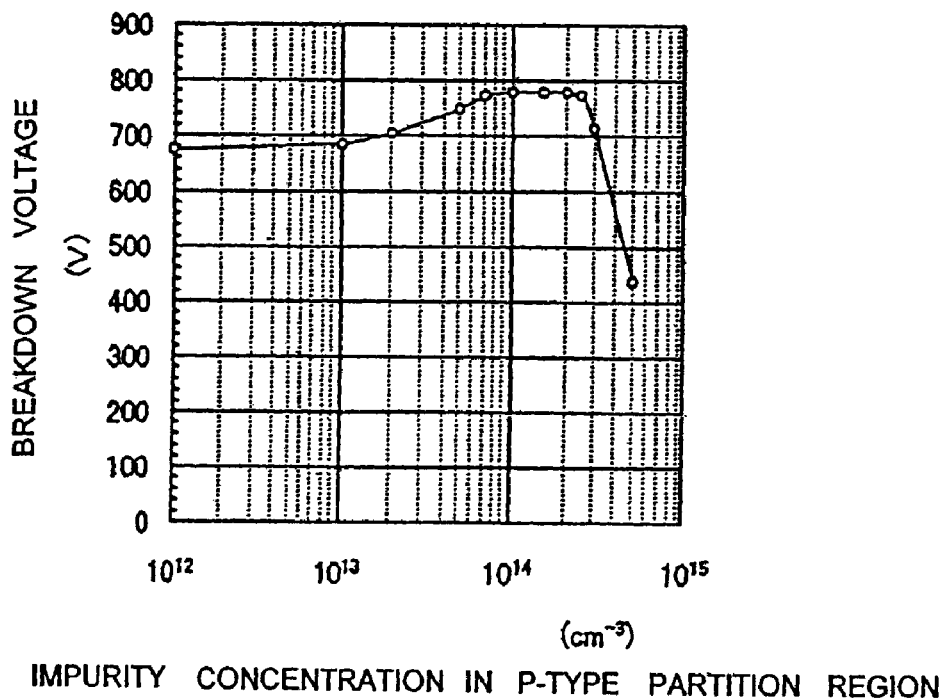
FIG. 3 is a characteristic curve relating the impurity concentration in the p-type partition region in the edge terminating section and the breakdown voltage with each other.

Impurity Concentration Range in the p-type Partition Region in the Edge Terminating Section The inventors of the present invention have found also that there exists a preferable impurity concentration range for p-type partition region 8 in edge terminating section 300. FIG. 3 describes a characteristic curve relating the impurity concentration in p-type partition region 8 and the breakdown voltage with each other for the thickness of p-type partition region 8 set at 50 μm.

As shown in FIG. 3, a high breakdown voltage is obtained when the impurity concentration in p-type partition region 8 is $2.5 \times 10^{14}$ cm$^{-3}$ or lower and, preferably, $2.0 \times 10^{14}$ cm$^{-3}$ or lower.

The impurity concentration of $2.5 \times 10^{14}$ cm$^{-3}$ in p-type partition region 8 allows the space charge region expanding from the pn-junction between p-type partition region 8 and n-type semiconductor substrate layer 1 to almost reach the surface portion of p-type partition region 8. When the impurity concentration in p-type partition region 8 is higher than $2.5 \times 10^{14}$ cm$^{-3}$, the space charge region cannot reach the surface portion of p-type partition region 8. When the space charge region cannot reach the surface portion of p-type partition region 8, a low breakdown voltage is caused, since the breakdown voltage is determined by the pn-junction between p-type partition region 8 and n-type semiconductor substrate layer 1.

Figure 4:
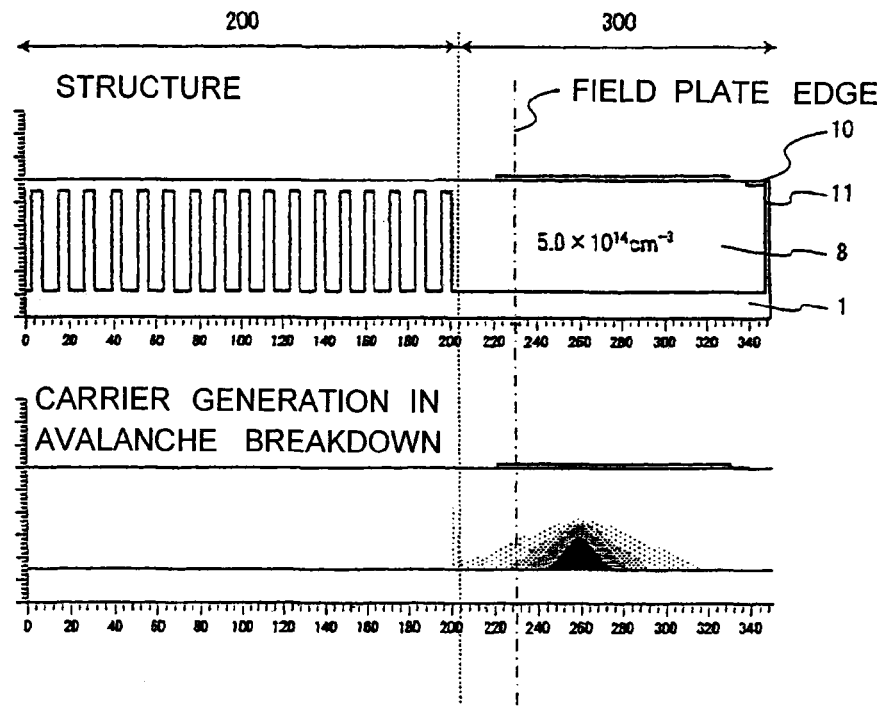
FIG. 4 describes the simulated carrier generation during avalanche breakdown caused.

FIG. 4 describes the simulated carrier generation in avalanche breakdown caused when the impurity concentration in p-type partition region 8 in edge terminating section 300 is set at $5 \times 10^{14}$ cm$^{-3}$. In FIG. 4, the cross sectional view of semiconductor device 100 is shown in the upper view and the simulated result of carrier generation caused during avalanche breakdown is shown in the lower view. As indicated by a broken line and a single-dotted chain line in FIG. 4, the position of active section 200 coincides between the top and bottom drawings and the position of edge terminating section 300 coincides between the top and bottom drawings. As FIG. 4 indicates, carriers are generated on the pn-junction between p-type partition region 8 and n-type semiconductor substrate layer 1 and avalanche breakdown is caused in this junction portion, thereby determining the breakdown voltage.

Therefore, it is preferable to set the impurity concentration in p-type partition region 8 at a value at which the space charge region expanding from the pn-junction between n-type semiconductor substrate layer 1 and p-type partition region 8 reaches the semiconductor surface portion. When the thickness of the space charge region expanding into a semiconductor layer is represented by $t_{Dep}$, the impurity concentration N in the semiconductor layer is expressed by the following formula (3) based on the Poisson equation. In formula (3), the unit charge is represented by q, the dielectric permeability of silicon by $\in_{Si}$, and the critical electric field strength of silicon by $E_{Critical}$.

$$N = \in_{Si} \times E_{Critical} / (q \times t_{Dep}) \quad (3)$$

Therefore, when the impurity concentration and the thickness of p-type partition region 8 are represented by $N_2$ and t respectively, it is preferable for the impurity concentration $N_2$ and the thickness t of p-type partition region 8 to satisfy the following relational expression (4). When the relational expression (4) is satisfied, the depletion layer expanding from n-type semiconductor substrate layer 1 in edge terminating section 300 reaches the first major surface of semiconductor device 100. It is more preferable for the impurity concentration $N_2$ and the thickness t of p-type partition region 8 to satisfy the following relational expression (5).

$$N_2 < \in_{Si} \times E_{Critical} / (q \times t) \quad (4)$$

$$N_2 < 0.8 \times \in_{Si} \times E_{Critical} / (q \times t) \quad (5)$$

Impurity Concentration in the n-type Pillar Region

It is preferable for the impurity concentration in n-type pillar region 11 to be the same or almost the same as the impurity concentration in n-type drift region 3. By setting the impurity concentration in n-type pillar region 11 as described above, it is possible to form n-type pillar region 11 and n-type drift region 3 simultaneously in manufacturing semiconductor device 100. If n-type pillar region 11 and n-type drift region 3 are formed simultaneously, the steps and costs of forming regions 11 and 3 may be reduced and a semiconductor device may be manufactured with low manufacturing costs.

Method of Manufacturing the Semiconductor Device

Now a method of manufacturing semiconductor device 100 will be described below. A method of manufacturing a super-junction MOSFET exhibiting a breakdown voltage of 600 V will be described as an example below mainly in connection with the construction of edge terminating section 300 thereof. FIGS. 5 through 12 are cross sectional views of semiconductor device 100 during the manufacturing process.

A semiconductor wafer including n-type semiconductor substrate layer 1, active section 200, edge terminating section 300, and a region having scribe plane 9 of semiconductor device 100 is formed. In active section 200, super-junction layer 4 including p-type partition regions 2 and n-type drift regions 3 is formed on n-type semiconductor substrate layer 1. In edge terminating section 300, p-type partition region 8 is formed on n-type semiconductor substrate layer 1. In the region having scribe plane 9 of semiconductor device 100, n-type pillar region 11 is formed on n-type semiconductor substrate layer 1. Super-junction layer 4, p-type partition region 8, and n-type pillar region 11 are formed to be as thick as 50 μm, for example. In super-junction layer 4, p-type partition regions 2 and n-type drift regions 3 are arranged alternately at a pitch of 6 μm, for example.

In super-junction layer 4, p-type partition region 2 contains boron and such a p-type impurity, and n-type drift region 3 contains phosphorus and such an n-type impurity. In super-junction layer 4, the average impurity concentration in p-type partition region 2 and n-type drift region 3 is $3 \times 10^{15}$ cm$^{-3}$, for example. In edge terminating section 300, p-type partition region 8 contains $1.0 \times 10^{14}$ cm$^{-3}$ of boron and such a p-type impurity. Pillar region 11 contains phosphorus and such an n-type impurity in the same extent as n-type drift region 3 in super-junction layer 4.

Now a simple and easy method for forming the semiconductor wafer described above will be described below with reference to FIGS. 5 through 9.

Figure 5:
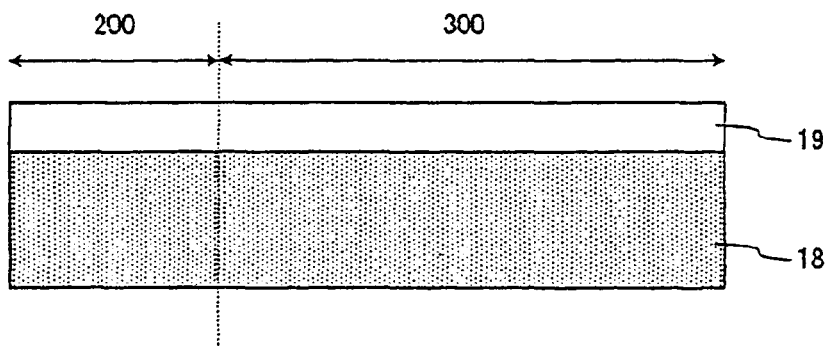
FIG. 5 is a first cross sectional view of the semiconductor device shown in FIGS. 1A and 1B under the manufacture thereof.

First, p-type semiconductor layer 19, containing $1.0 \times 10^{14}$ cm$^{-3}$ of boron and 6 μm to 10 μm in thickness, is grown on n-type Si semiconductor substrate 18 doped heavily (FIG. 5).

Figure 6:
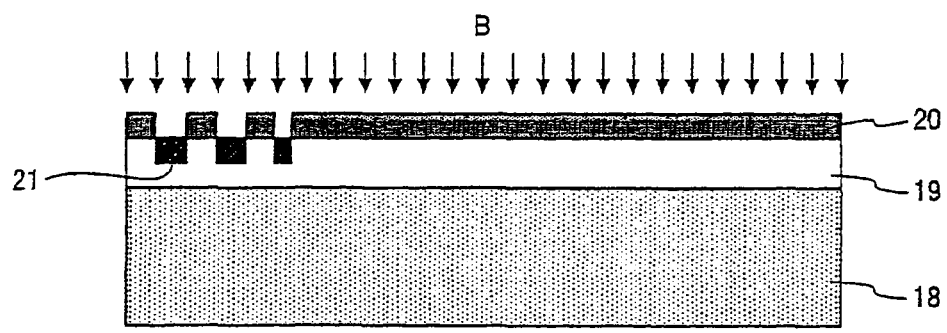
FIG. 6 is a second cross sectional view of the semiconductor device shown in FIGS. 1A and 1B during manufacturing.

Photoresist mask 20 is formed and p-type impurity ions such as boron (B) ions are implanted to portions 21 which will be p-type partition regions 2 of super-junction layer 4 such that portions 21 contain a predetermined concentration of the p-type impurity (FIG. 6).

Figure 7:
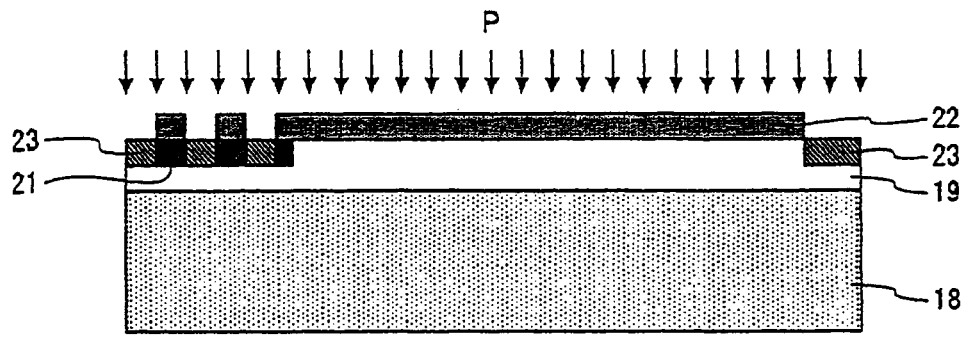
FIG. 7 is a third cross sectional view of the semiconductor device shown in FIGS. 1A and 1B during manufacturing.
Figure 8:
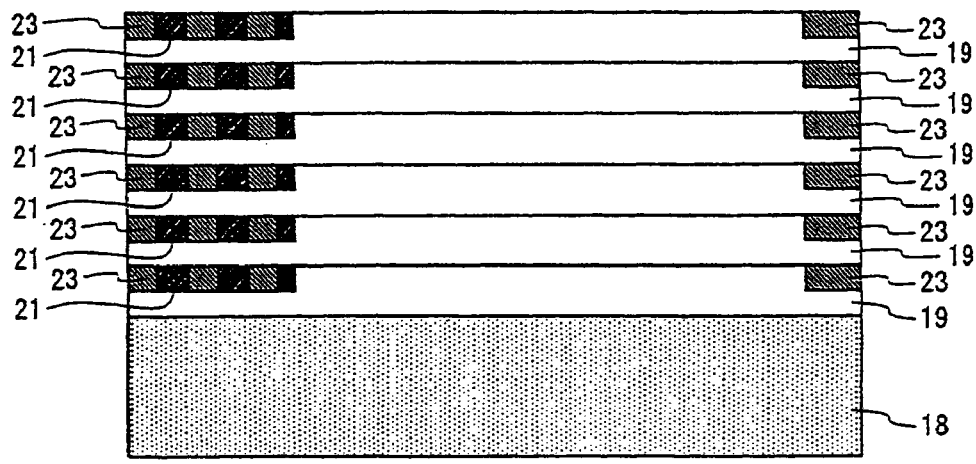
FIG. 8 is a fourth cross sectional view of the semiconductor device shown in FIGS. 1A and 1B during manufacturing.

Photoresist mask 22 is formed and n-type ions such as phosphorus (P) ions are implanted to portions 23 which will be n-type drift regions 3 of super-junction layer 4 and n-type pillar region 11 such that portions 23 contain a predetermined concentration of the n-type impurity (FIG. 7). The step described with reference to FIG. 7 (hereinafter referred to as the "step of FIG. 7") may be conducted prior to the step described with reference to FIG. 6 (hereinafter referred to as the "step of FIG. 6") with no problem. The step of FIG. 6 and the step of FIG. 7 are repeated alternately 5 to 8 times (FIG. 8).

Figure 9:
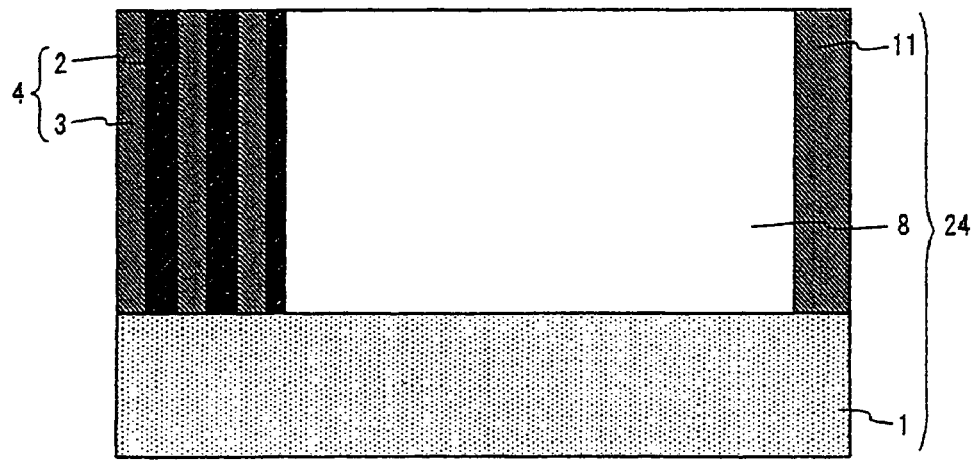
FIG. 9 is a fifth cross sectional view of the semiconductor device shown in FIGS. 1A and 1B during manufacturing.

By thermally treating the semiconductor wafer at 1150° C. for 10 hours, super-junction wafer 24 that includes super-junction layer 4 including p-type partition regions 2 and n-type drift regions 3 on substrate layer 1, p-type partition region 8 on substrate layer 1, and n-type pillar region 11 on substrate layer 1 is formed (FIG. 9). The portion into which no impurity ions are implanted in the steps of FIGS. 6 and 7, provides p-type partition region 8 in edge terminating section 300. In the subsequent steps, super-junction wafer 24 formed as described above is used.

Figure 10:
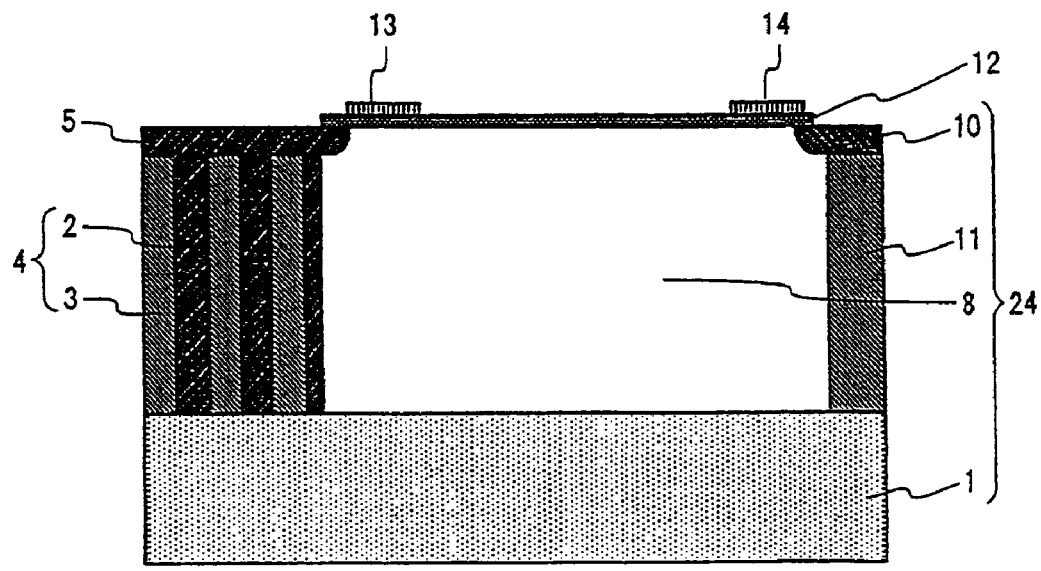
FIG. 10 is a sixth cross sectional view of the semiconductor device shown in FIGS. 1A and 1B during manufacturing.

As shown in FIG. 10, oxide film 12 of 0.8 μm in thickness is formed on the major surface (first major surface) of super-junction wafer 24 on the side of super-junction layer 4. Then, the portion of oxide film 12 outside edge terminating section 300 is removed by photolithographic and etching techniques. Then, although not shown, a gate oxide film of 100 nm in thickness is formed and polysilicon is grown on the not shown gate oxide film. Then, the polysilicon is doped heavily by vapor-phase diffusion or by ion implantation and a gate electrode with a predetermined shape is formed by photolithography and etching. Simultaneously, field plates 13 and 14 on the first level are formed in edge terminating section 300.

Then, boron ions are implanted at the dose amount of $1.0 \times 10^{14}$ cm$^{-2}$ from the first major surface of super-junction wafer 24 and super-junction wafer 24 is treated thermally. Boron ions are further implanted at the dose amount of $1.0 \times 10^{15}$ cm$^{-2}$ from the first major surface of super-junction wafer 24 using a photoresist for a mask. Furthermore, arsenic ions are implanted at the dose amount of $5 \times 10^{15}$ cm$^{-2}$ from the first major surface of super-junction wafer 24 using a photoresist for a mask and super-junction wafer 24 is treated thermally.

Although not shown in FIG. 10, a p-type base region, a p-type body region, and a source region are formed in active section 200 through the steps of ion implantation and thermal treatment described above. In edge terminating section 300, p-type base/body region 5 and n-type channel stopper region 10 are formed through the steps of ion implantation and thermal treatment described above (FIG. 10).

Figure 11:
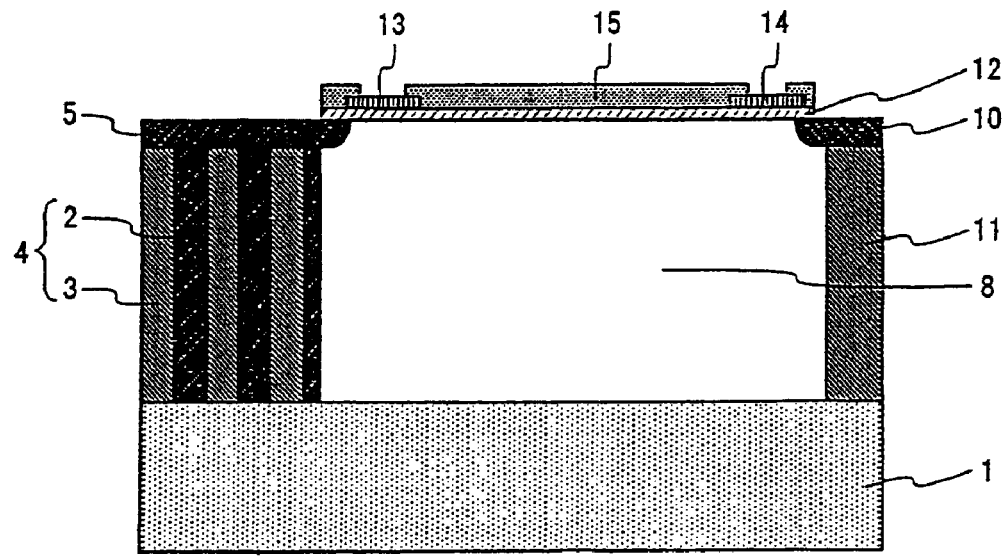
FIG. 11 is a seventh cross sectional view of the semiconductor device shown in FIGS. 1A and 1B during manufacturing.

Then, a silicon oxide film, containing phosphorus or boron and having a thickness of 1.1 μm, is formed on the first major surface of super-junction wafer 24 and contact holes are opened in the silicon oxide film through predetermined photolithographic and etching steps. Then, reflow is conducted at 900° C., for example, to form interlayer insulator film 15 (FIG. 11).

Figure 12:
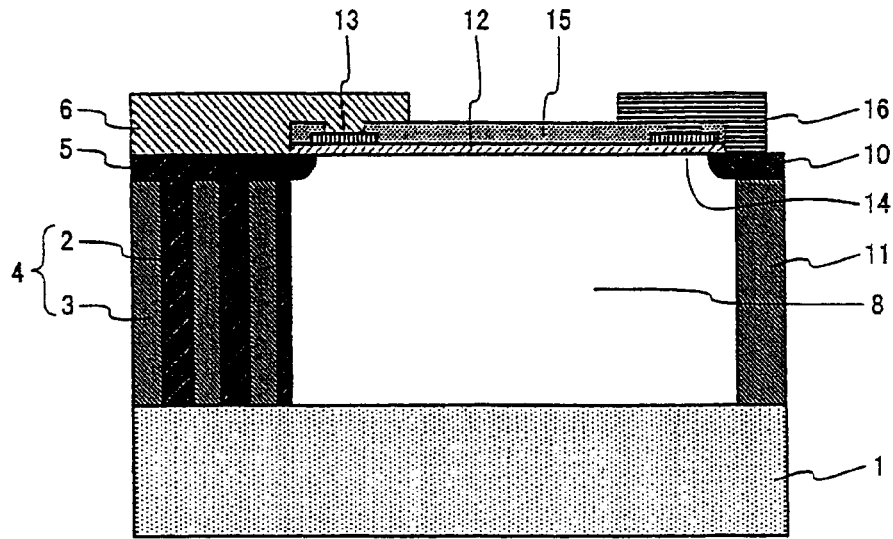
FIG. 12 is an eighth cross sectional view of the semiconductor device shown in FIGS. 1A and 1B during manufacturing.

Subsequently, an aluminum film containing 1 wt. % of silicon is grown to 3 μm in thickness on the first major surface of super-junction wafer 24. Source electrode 6 and channel stopper electrode 16 are formed of the aluminum film through photolithographic and etching steps (FIG. 12). Then, a polyimide film of 10 μm in thickness is formed on the first major surface of super-junction wafer 24 and passivation film 17 (shown in FIG. 1A) is formed of the polyimide film through photolithographic and etching steps.

Subsequently, drain electrode 7 (shown in FIG. 1A) is formed by depositing titanium, nickel, and gold on the second major surface of super-junction wafer 24, i.e., on the side of n-type semiconductor substrate layer 1, in the order of above description.

Thus, active section 200 of the super-junction MOSFET as shown in FIGS. 1A and 1B and edge terminating section 300 of the super-junction MOSFET having a multilevel field plate structure and a channel stopper structure are completed.

Finally, the wafer is cut by a dicer into chips between adjacent channel stopper electrodes 16, between which no semiconductor device 100 is formed, resulting in completed super-junction MOSFETs. The MOSFET manufactured by the method described above is a vertical planar MOSFET.

Comparison with Conventional Semiconductor Device

Figure 13:
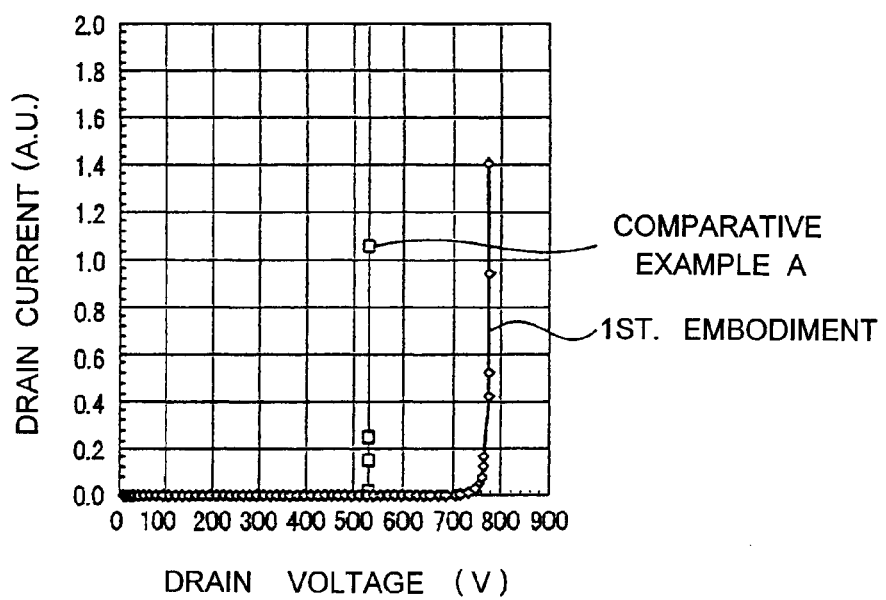
FIG. 13 is a couple of curves describing the simulated breakdown voltages.
Figure 14:
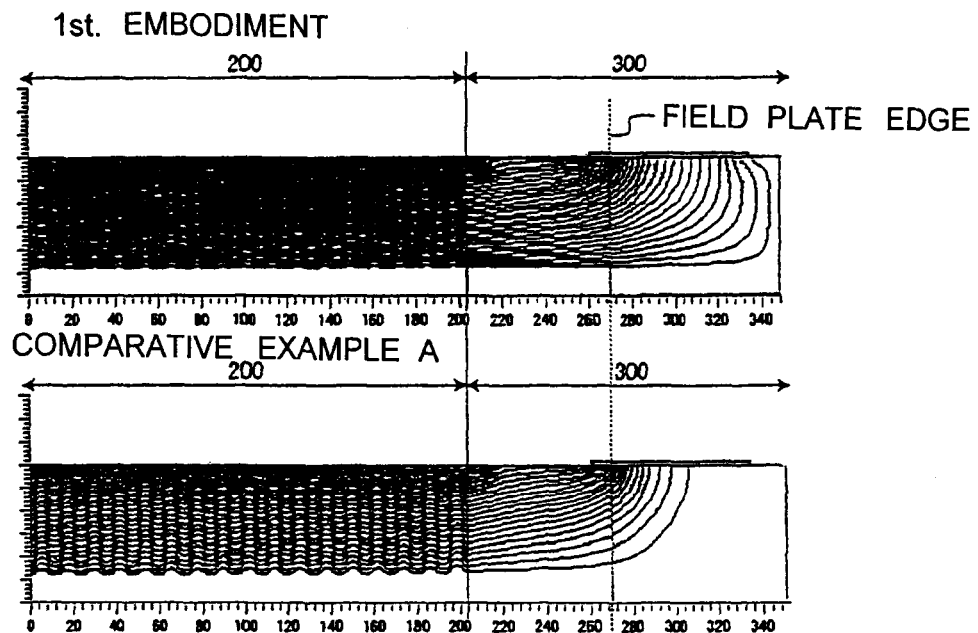
FIG. 14 compares the simulated potential distributions when avalanche breakdown is caused.
Figure 15:
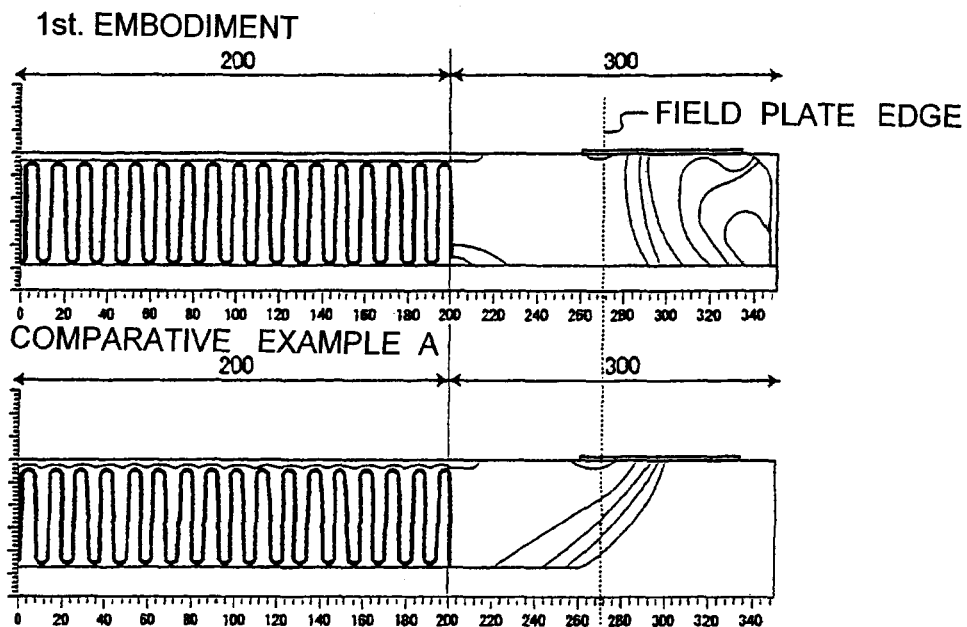
FIG. 15 compares the simulated electric field distributions when avalanche breakdown is caused.
Figure 16:
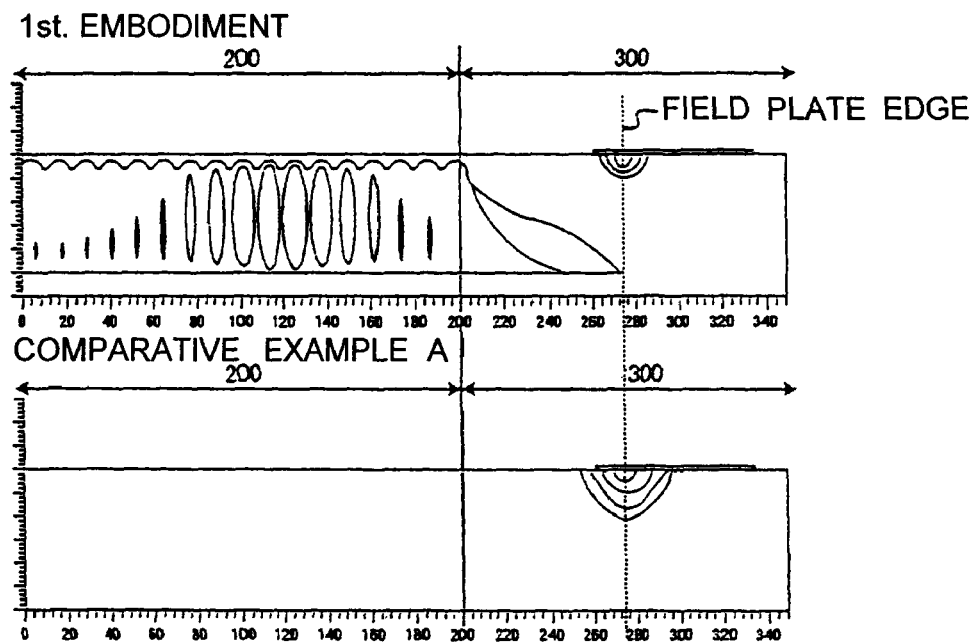
FIG. 16 compares the impact ionization rates when avalanche breakdown is caused.
Figure 17:
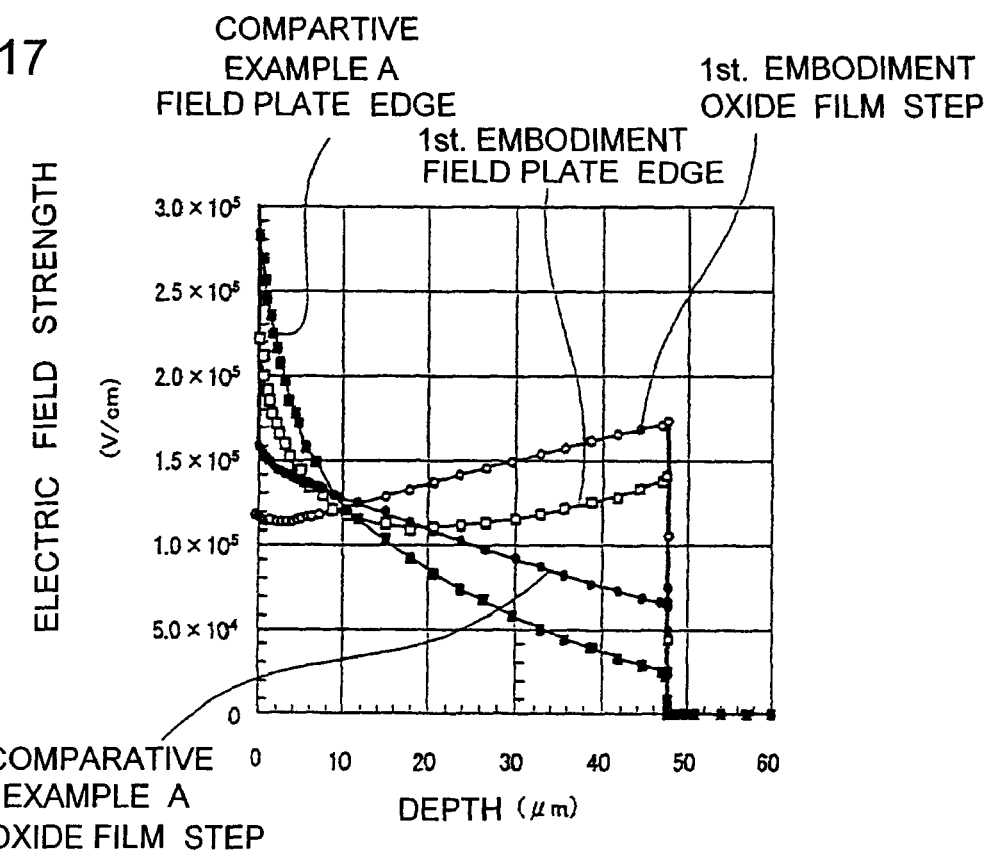
FIG. 17 is a set of curves describing the electric field strength distributions in the depth direction in the field plate structure when avalanche breakdown is caused.

FIG. 13 includes two curves describing the simulated breakdown voltages for the semiconductor device according to the first embodiment of the invention and a super-junction semiconductor device having a conventional structure (hereinafter referred to as a "comparative example A"). FIG. 14 compares the simulated potential distributions when avalanche breakdown is caused. FIG. 15 compares the simulated electric field distributions when avalanche breakdown is caused. FIG. 16 compares the impact ionization rates when avalanche breakdown is caused. FIG. 17 is a set of curves describing the electric field strength distributions in the depth direction on the active-section-side field plate edge and in the oxide film step portion for the semiconductor devices according to the first embodiment and the comparative example A, in which avalanche breakdown is caused.

Figure 18:
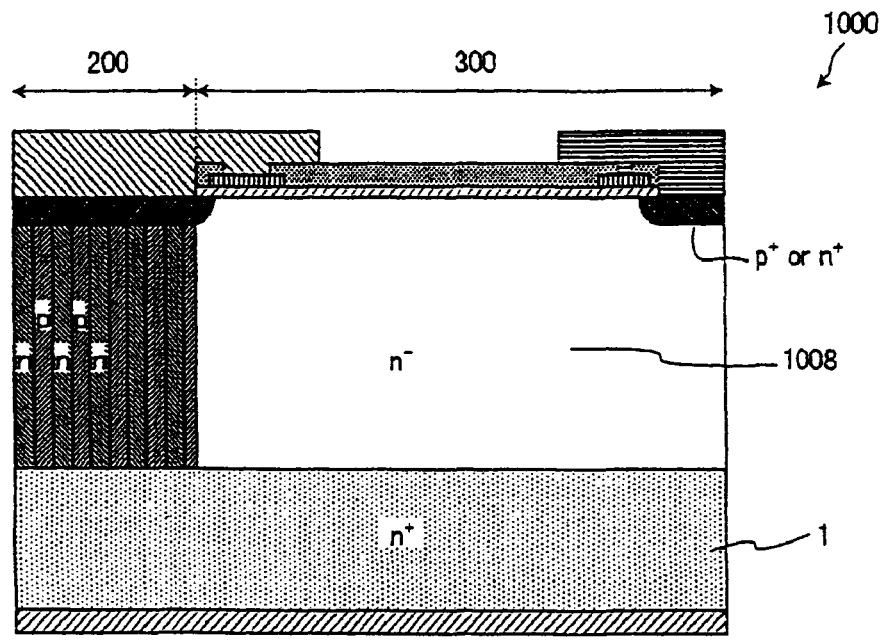
FIG. 18 is a cross sectional view of a conventional semiconductor device employed in FIGS. 13 through 17 for comparison with the semiconductor device according to the first embodiment.

FIG. 18 is a cross sectional view of a semiconductor device according to the comparative example A. In FIG. 18, semiconductor device 1000 according to the comparative example A is different from semiconductor device 100 according to the first embodiment of the invention only in that the conductivity type of semiconductor region 1008 in edge terminating section 300 is an n-type.

As FIG. 13 indicates, semiconductor device 100 according to the first embodiment exhibits a breakdown voltage higher than the avalanche breakdown voltage of semiconductor device 1000 according to the comparative example A.

Equipotential surfaces curve sharply on the field plate edge in semiconductor device 100 according to the first embodiment and in the semiconductor device according to the comparative example A as shown in FIG. 14. It is estimated that the electric field strength is high in the portion in which the equipotential surfaces curve sharply.

FIG. 15 indicates that the electric field strength on the field plate edge in semiconductor device 100 according to the first embodiment is as high as the electric field strength on the field plate edge in the semiconductor device according to the comparative example A. However, as FIG. 17 indicates, the electric field strength on the field plate edge in semiconductor device 100 according to the first embodiment is lower than the electric field strength on the field plate edge in the semiconductor device according to the comparative example A.

The main junction plane that sustains the breakdown voltage is the boundary between n-type semiconductor substrate 1 and p-type partition section 8 in edge terminating section 300 in semiconductor device 100 according to the first embodiment. The electric field strength lowers toward the first major surface, beneath which p-type base/body region 5 is formed.

Since semiconductor region 1008 in semiconductor device 1000 according to the comparative example A is an n-type one, the main junction plane that sustains the breakdown voltage is the surface portion of n-type semiconductor region 1008, i.e., the plane on which p-type base/body region 5 is formed. Therefore, the multiplier effect of the electric field strength rise on the flat junction plane and the formation of a high-electric-field portion caused by electric field localization is caused in semiconductor device 1000 according to the comparative example A.

As FIG. 16 indicates, the impact ionization rate is high on the field plate edge on the second level (i.e., the edge portion of the source electrode) in semiconductor device 1000 according to the comparative example A. Therefore, it is indicated that the breakdown voltage is determined by the field plate edge on the second level. In contrast, the impact ionization rate is high in active section 200 in semiconductor device 100 according to the first embodiment. Therefore, it is indicated that the designed breakdown voltage of main pn-junctions in active section 200 is secured in semiconductor device 100.

According to the first embodiment, the main junction (the pn-junction biased in reverse) in edge terminating section 300 is not on the p-type base region side of super-junction wafer 24 but the pn-junction between n-type semiconductor substrate layer 1 and p-type partition region 8. In other words, the portion of the flat junction plane, in which the electric field strength rises, is the boundary between n-type semiconductor substrate layer 1 and p-type partition region 8 in edge terminating section 300. Therefore, no multiplier effect is caused in semiconductor device 100 according to the first embodiment, even when a high-electric-field portion is caused on the p-type base region side of super-junction wafer 24 by electric field localization. Therefore, the designed breakdown voltage of the main pn-junctions in active section 200 is secured in semiconductor device 100.

Second Embodiment

Cross Sectional Structure of Semiconductor Device

Figure 19:
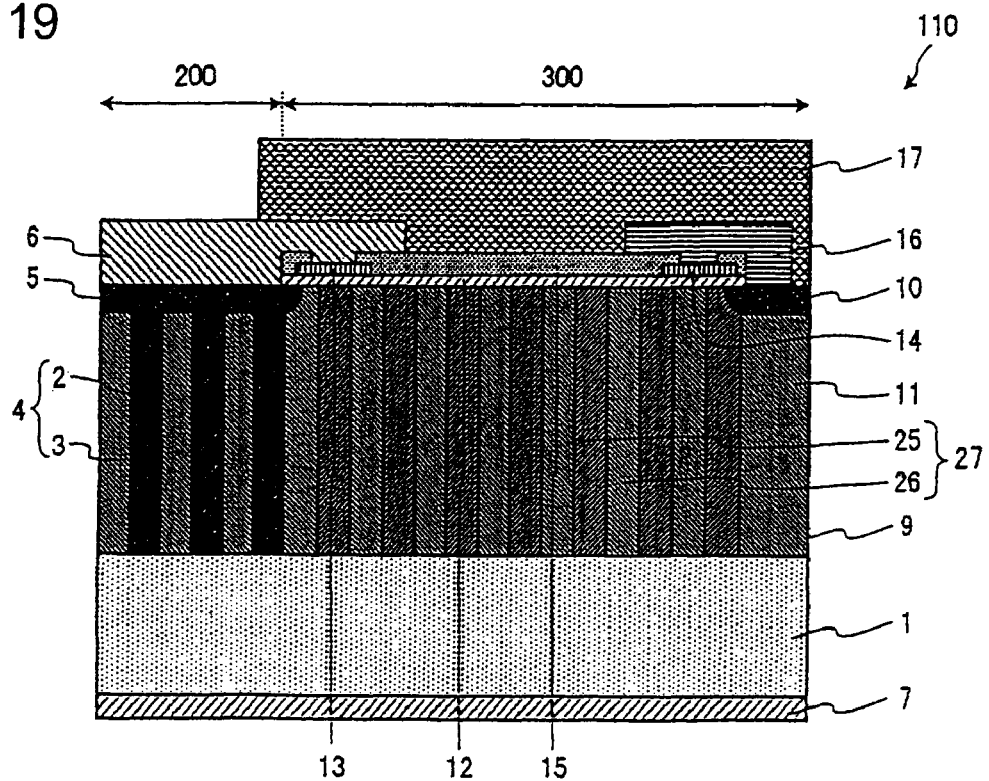
FIG. 19 is a cross sectional view of a semiconductor device according to a second embodiment of the invention.

FIG. 19 is a cross sectional view of a semiconductor device according to a second embodiment of the invention. Referring now to FIG. 19, semiconductor device 110 according to the second embodiment is different from semiconductor device 100 according to the first embodiment in that the semiconductor region on n-type semiconductor substrate layer 1 in edge terminating section 300 is comprised of super-junction layer 27 including p-type partition regions 25 and n-type drift regions 26 arranged alternately. Super-junction layer 27 in edge terminating section 300 is a p-type one, the average concentration $N_{Ave}$ thereof is $1.0 \times 10^{14}$ cm$^{-3}$. Since the other structures are the same as those according to the first embodiment, their descriptions will not be repeated for the sake of simplicity.

In the semiconductor device according to the second embodiment, the average concentration $N_{Ave}$ is set to be $2.5 \times 10^{14}$ cm$^{-3}$ or lower and, more preferably, to be $2.0 \times 10^{14}$ cm$^{-3}$ or lower to obtain a high breakdown voltage.

Averacle Impurity Concentration Range in the Super-Junction Layer in the Edge Terminating Section The average concentration $N_{Ave}$ is expressed by the following formula (6) using the volume $V_{Edge}$ of super-junction layer 27 on n-type semiconductor substrate layer 1 in edge terminating section 300, the total n-type impurity amount $N_1$ in super-junction layer 27, and the total p-type impurity amount $N_2$ in super-junction layer 27.

$$N_{Ave} = (|N_2| - |N_1|)/V_{Edge} \tag{6}$$

Here, it is assumed that $|N_2| \geq |N_1|$.

By representing the width of p-type partition region 25 on n-type semiconductor substrate layer 1 in edge terminating section 300 by t, the relational expressions (4) and (5) are rewritten into the following relational expressions (7) and (8), respectively.

$$N_{Ave} < \varepsilon_{Si} \times E_{Critical}/(q \times t) \tag{7}$$

$$N_{Ave} < 0.8 \times \varepsilon_{Si} \times E_{Critical}/(q \times t) \tag{8}$$

When the relational expression (7) is satisfied, a depletion layer reaches the first major surface of semiconductor device 110 from n-type semiconductor substrate layer 1 in edge terminating section 300. When the relational expression (8) is satisfied, the depletion layer surely reaches the first major surface of semiconductor device 110 from n-type semiconductor substrate layer 1 in edge terminating section 300.

Semiconductor Device Planar Structure

Figure 20:
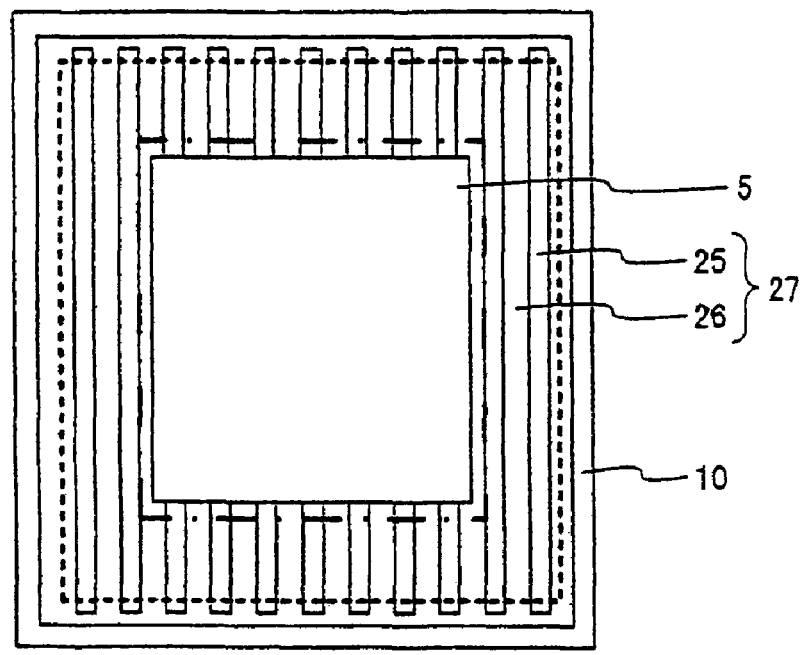
FIG. 20 is a first top plan view of the semiconductor device according to the second embodiment of the invention.
Figure 21:
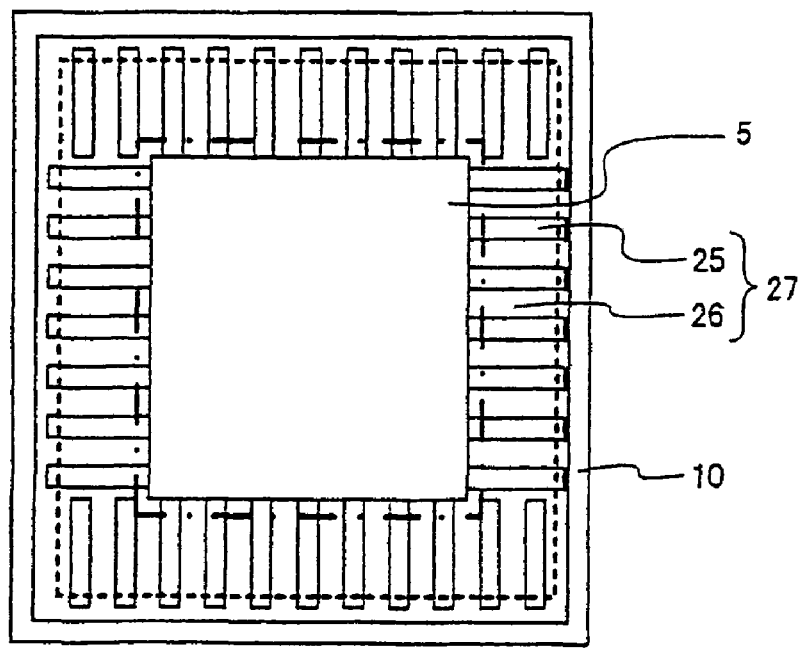
FIG. 21 is a second top plan view of the semiconductor device according to the second embodiment of the invention.
Figure 22:
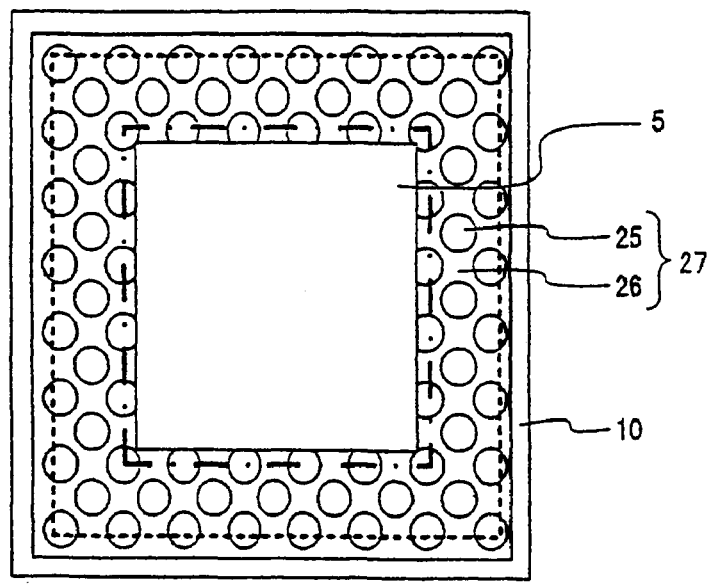
FIG. 22 is a third top plan view of the semiconductor device according to the second embodiment of the invention.

FIGS. 20 through 22 are top plan views of the semiconductor device according to the second embodiment. In these drawings, the structure above the surfaces of p-type base/body region 5, n-type channel stopper region 10, p-type partition regions 25 in super-junction layer 27, and n-type drift regions 26 in super-junction layer 27 is omitted. In other words, the surfaces of p-type base/body region 5, n-type channel stopper region 10, p-type partition regions 25 in super-junction layer 27, and n-type drift regions 26 in super-junction layer 27 are shown in FIGS. 20 through 22.

In semiconductor device 110 according to the second embodiment, all p-type partition regions 25 or all n-type drift regions 26 in edge terminating section 300 may be shaped as stripes extending in one direction with no problem as shown in FIG. 20. Alternatively, the extending direction of p-type partition regions 25 or n-type drift regions 26 in edge terminating section 300 may differ by 90° between the adjacent sides of a rectangular chip with no problem as shown in FIG. 21. Still alternatively, the surface shape of p-type partition regions 25 or n-type drift regions 26 in edge terminating section 300 may be circular with no problem as shown in FIG.

22. In other words, p-type partition region 25 or n-type drift region 26 in edge terminating section 300 may be shaped with a circular column.

Method of Manufacturing the Semiconductor Device

Now a method of manufacturing semiconductor device 110 will be described below. A method of manufacturing a super-junction MOSFET exhibiting a breakdown voltage of 600 V will be described as an example below mainly in connection with the construction of edge terminating section 300 thereof. FIGS. 23 through 27 are cross sectional views of semiconductor device 110 during the manufacturing process.

A semiconductor wafer including n-type semiconductor substrate layer 1, active section 200, edge terminating section 300, and a region having scribe plane 9 of semiconductor device 110 is formed. In active section 200, super-junction layer 4 including p-type partition regions 2 and n-type drift regions 3 is formed on n-type semiconductor substrate layer 1. In edge terminating section 300, super-junction layer 27 including p-type partition regions 25 and n-type drift regions 26 is formed on n-type semiconductor substrate layer 1. In the region having scribe plane 9 of semiconductor device 110, n-type pillar region 11 is formed on n-type semiconductor substrate layer 1.

Now a simple and easy method for forming the semiconductor wafer described above will be described below with reference to FIGS. 23 through 27.

Figure 23:
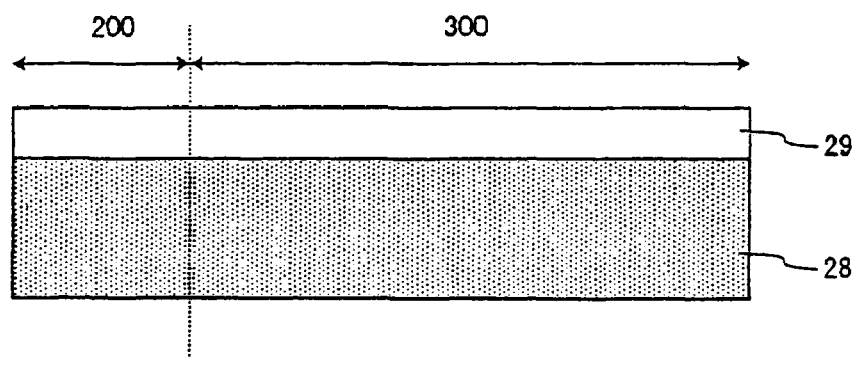
FIG. 23 is a first cross sectional view of the semiconductor device shown in FIG. 19 during manufacturing.

First, n-type semiconductor layer 29, exhibiting the resistivity of 15 Ωcm and 6 μm to 10 μm in thickness, is grown on n-type Si semiconductor substrate 28 containing $2.0 \times 10^{18}$ cm$^{-3}$ of antimony (FIG. 23).

Figure 24:
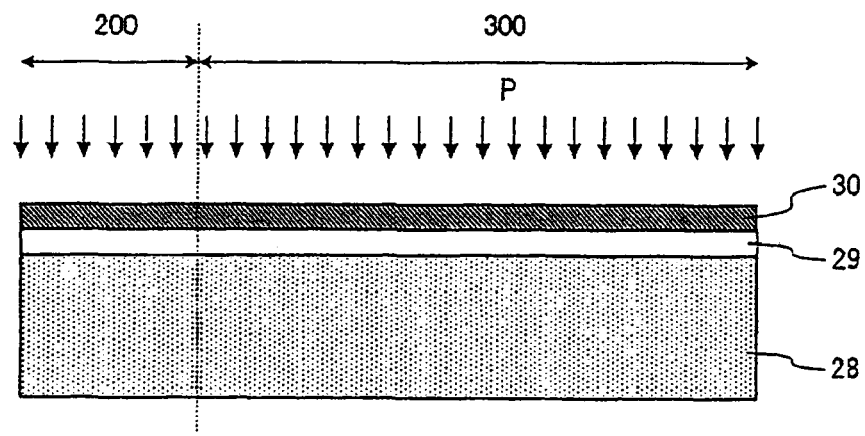
FIG. 24 is a second cross sectional view of the semiconductor device shown in FIG. 19 during manufacturing.

Then, phosphorus ions are implanted into the entire surface portion of n-type semiconductor layer 29 at a dose amount between $10^{13}$ cm$^{-2}$ and $10^{14}$ cm$^{-2}$ (FIG. 24). In FIG. 24, an n-type impurity such as phosphorus is implanted into region 30.

Photoresist is coated on the phosphorus implanted surface and mask 31 is formed by forming openings in the predetermined locations in the photoresist. The openings are formed such that the openings in the section in which edge terminating section 300 will be formed are wider than the openings in the section in which p-type base/body region 5 will be formed. P-type impurity ions such as boron ions are implanted into the section, which will be active section 200, at a concentration that facilitates maintaining charge valance corresponding to the opening width of mask 31.

Figure 25:
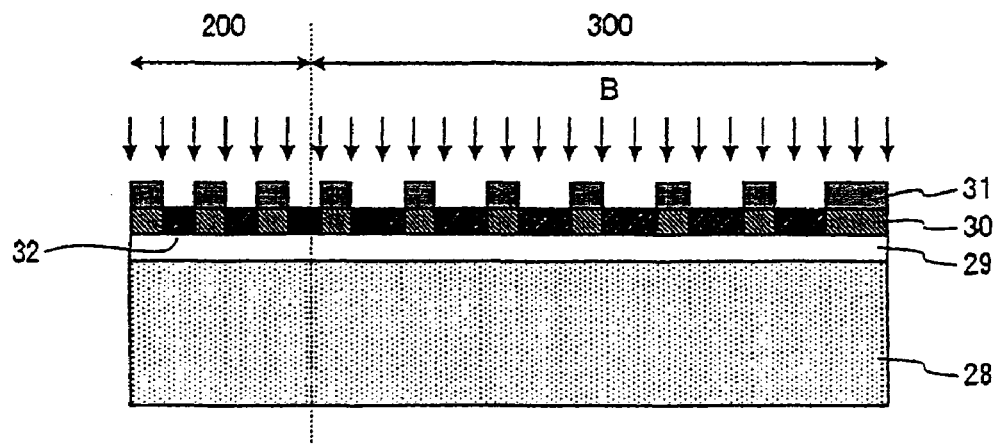
FIG. 25 is a third cross sectional view of the semiconductor device shown in FIG. 19 during manufacturing.

Since the opening width of mask 31 is wider in the section in which edge terminating section 300 will be formed, as described above, the amount of boron implanted into the section in which edge terminating section 300 is formed is larger than the amount of phosphorus implanted into the section in which edge terminating section 300 will be formed (FIG. 25). In FIG. 25, a p-type impurity such as boron is implanted into regions 32.

Figure 26:
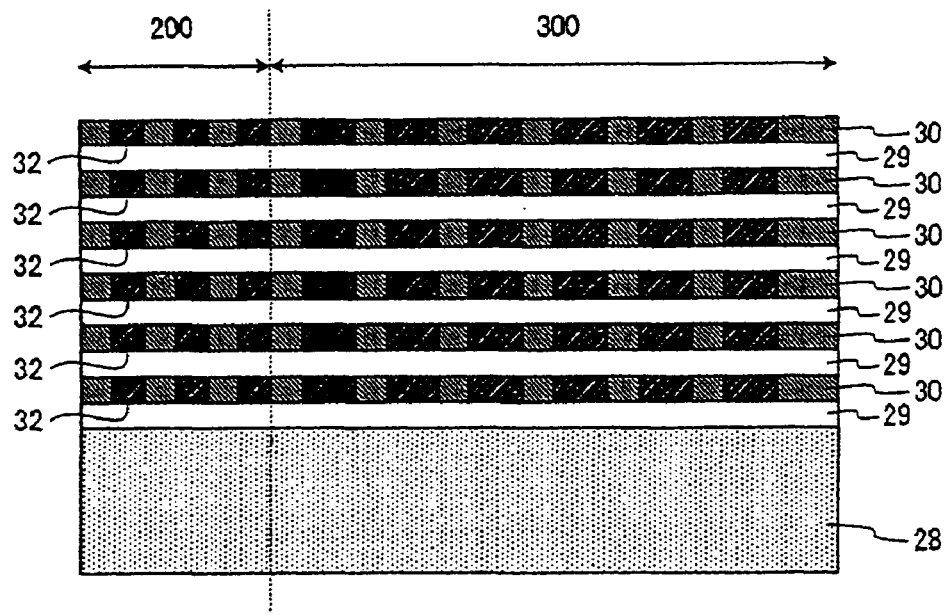
FIG. 26 is a fourth cross sectional view of the semiconductor device shown in FIG. 19 during manufacturing.

The step described with reference to FIG. 24 and the step described with reference to FIG. 25 are repeated alternately 5 to 8 times (FIG. 26).

Figure 27:
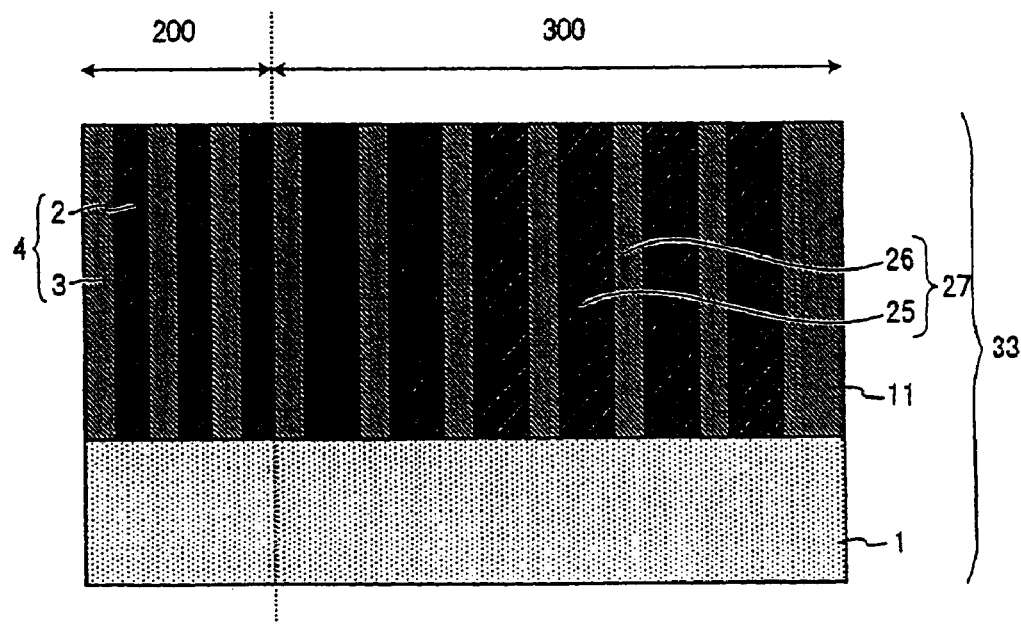
FIG. 27 is a fifth cross sectional view of the semiconductor device shown in FIG. 19 during manufacturing.

By thermally treating the semiconductor wafer at 1150° C. for 10 hours, for example, super-junction wafer 33 that includes super-junction layer 4 including p-type partition regions 2 and n-type drift regions 3, super-junction layer 27 including p-type partition regions 25 and n-type drift regions 26, and n-type pillar region 11 formed on n-type semiconductor substrate layer 1 is completed (FIG. 27).

Using super-junction wafer 33, a gate oxide film, a gate electrode, field plates 13 and 14, p-type base/body region 5, a source region, n-type channel stopper region 10, interlayer insulator film 15, source electrode 6, and channel stopper electrode 16 are formed in the same manner as in the first embodiment (cf. FIGS. 10 through 12). Further, passivation film 17 and drain electrode 7 are formed.

Thus, active section 200 of a super-junction MOSFET as shown in FIG. 19 and edge terminating section 300 of the super-junction MOSFET having a multilevel field plate structure and a channel stopper structure are completed.

Finally, the wafer is cut by a dicer into chips between adjacent channel stopper electrodes 16, between which no semiconductor device 110 is formed, and individual super-junction MOSFETs are completed.

In the semiconductor device according to the second embodiment, the electric field distribution in edge terminating section 300 is almost the same as that in the semiconductor device according to the first embodiment. Even when a high-electric-field portion is caused on the p-type base region side of super-junction wafer 33 by electric field localization, no multiplier effect is caused in semiconductor device 110. Therefore, the designed breakdown voltage of the main pn-junctions in active section 200 is secured in semiconductor device 110 according to the second embodiment.

Third Embodiment

Semiconductor Device Structure

Figure 28:
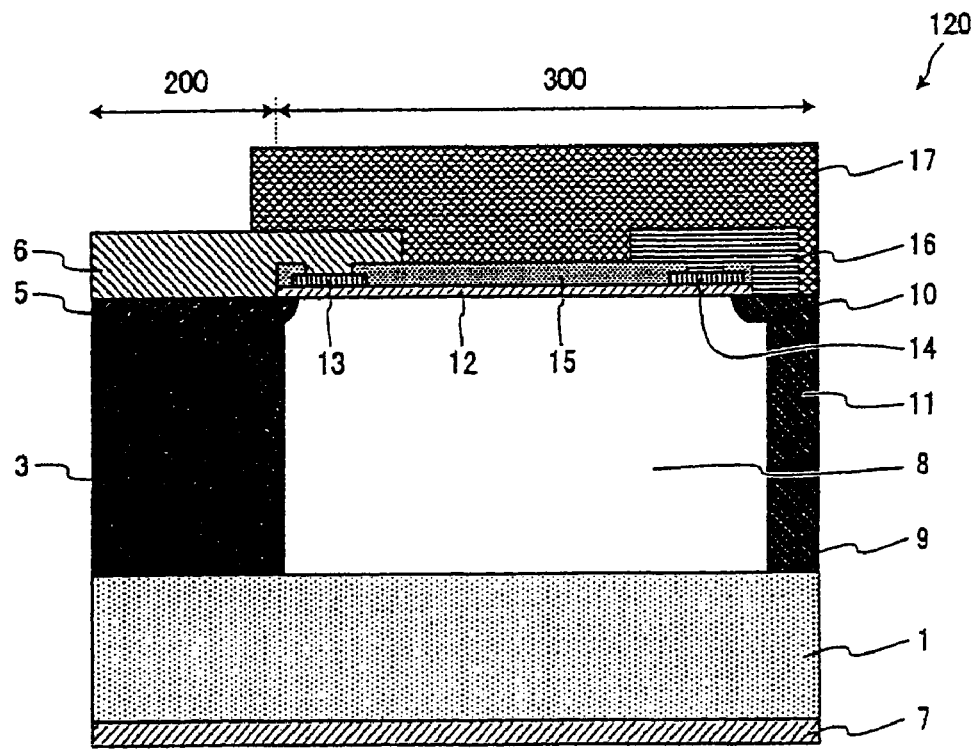
FIG. 28 is a cross sectional view of a semiconductor device according to a third embodiment of the invention.

FIG. 28 is a cross sectional view of a semiconductor device according to a third embodiment of the invention. Referring now to FIG. 28, semiconductor device 120 according to the third embodiment is different from the semiconductor device according to the first embodiment in that active section 200 in semiconductor device 120 includes one n-type drift region 3 in contact with p-type base/body region 5 but not a plurality of n-type drift regions 3. In other words, active section 200 is not divided into a plurality of n-type drift regions 3 by p-type partition regions. The concentration in n-type drift region 3 is $2.5 \times 10^{14}$ cm$^{-3}$, for example. The concentration in p-type partition region 8 in edge terminating section 300 is $1.0 \times 10^{14}$ cm$^{-3}$. Since the other structure is the same with that in the semiconductor device according to the first embodiment, the descriptions thereof will not be repeated.

Method of Manufacturing the Semiconductor Device

Now a method of manufacturing semiconductor device 120 will be described below. A method of manufacturing a super-junction MOSFET exhibiting a breakdown voltage of 600 V will be described as an example below mainly in connection with the construction of edge terminating section 300 thereof. FIGS. 29 through 34 are cross sectional views of semiconductor device 120 during the manufacturing process.

A semiconductor wafer including n-type semiconductor substrate layer 1, active section 200, edge terminating section 300, and a region having scribe plane 9 of semiconductor device 120 is formed. In active section 200, n-type drift region 3 is formed on n-type semiconductor substrate layer 1. In edge terminating section 300, p-type partition region 8 is formed on n-type semiconductor substrate layer 1. In the region having scribe plane 9 of semiconductor device 120, n-type pillar region 11 is formed on n-type semiconductor substrate layer 1.

Now a simple and easy method for forming the semiconductor wafer described above will be described below with reference to FIGS. 29 through 34.

Figure 29:
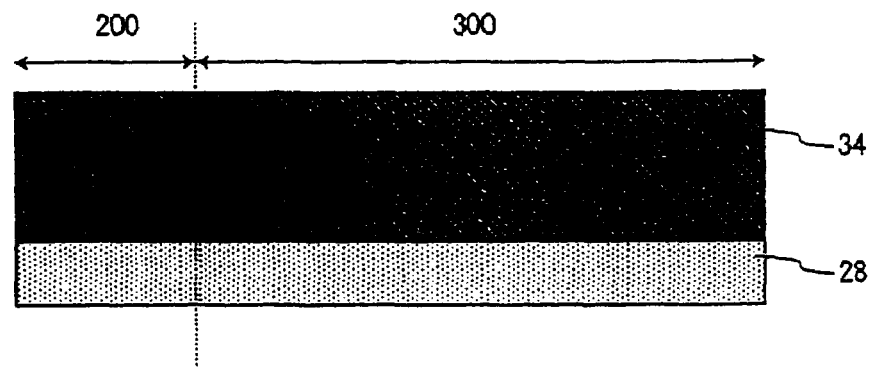
FIG. 29 is a first cross sectional view of the semiconductor device shown in FIG. 28 during manufacturing.

First, n-type semiconductor layer 34, containing $2.5 \times 10^{14}$ cm$^{-3}$ of phosphorus, is grown to 50 μm in thickness on n-type Si semiconductor substrate 28 containing $2.0 \times 10^{18}$ cm$^{-3}$ of antimony (FIG. 29).

Figure 30:
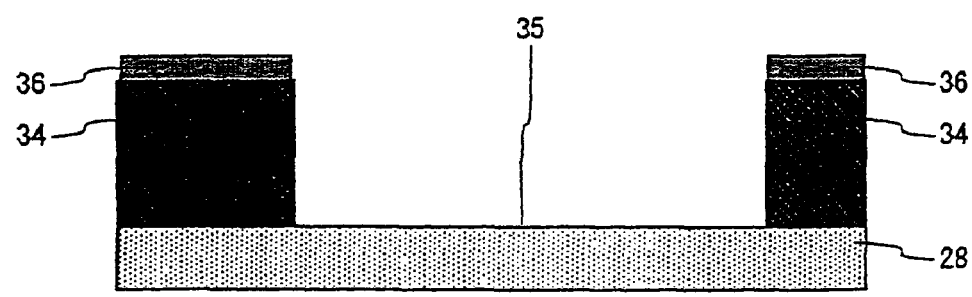
FIG. 30 is a second cross sectional view of the semiconductor device shown in FIG. 28 during manufacturing.

Trench 35, of 150 μm in width and 50 μm in depth, is formed in a portion of n-type semiconductor layer 34 corresponding to the section in which edge terminating section 300 will be formed (FIG. 30).

In forming trench 35, an oxide film is grown on n-type semiconductor layer 34 by thermal oxidation. Mask 36 having an opening in the section of the oxide film, under which edge terminating section 300 will be formed, is formed. Dry etching is conducted by reactive ion etching (hereinafter referred to as "RIE") using mask 36. If mask 36 is set to be 2.4 μm in thickness before trench etching, mask 36 will not be completely etched by the trench etching and mask 36 of 0.4 μm in thickness will remain unetched at the end of the trench etching.

A plasma etcher employing the inductive coupling plasma method (hereinafter referred to as the "ICP method") is used for the trench etching. Etching conditions include an HBr gas flow rate set at 40 sccm, an $SF_6$ gas flow rate set at 120 sccm, an $O_2$ gas flow rate set at 120 sccm, a plasma source power set at 1200 W, a bias power set at 140 W, a pressure set at 3.3 Pa, and an etching time set at 15 minutes.

Although RIE etching by the ICP method is described above as an example, a plasma etcher employing the electron cyclotron resonance method (hereinafter referred to as the "ECR method") and a Bosch-type trench etcher may be used alternatively as far as trench 35 having the desired width and depth is obtained.

Trench 35 may be formed such that the bottom thereof is positioned 10 μm above or below the boundary between n-type Si semiconductor substrate 28 and n-type semiconductor layer 34.

Figure 31:
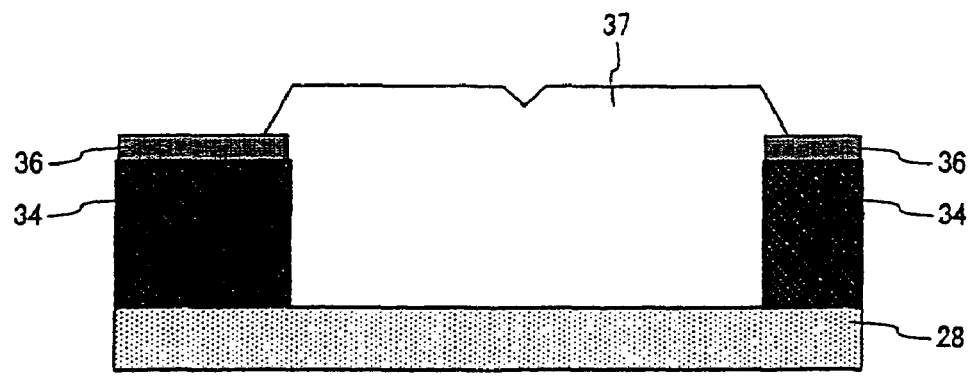
FIG. 31 is a third cross sectional view of the semiconductor device shown in FIG. 28 during manufacturing.

P-type semiconductor layer 37 containing $1.0 \times 10^{14}$ $cm^{-3}$ of a p-type impurity such as boron is grown in an epitaxial manner in trench 35 (FIG. 31). In the epitaxial growth, p-type semiconductor layer 37 may be grown at 1000° C. under ordinary pressure using trichlorosilane (hereinafter referred to as "TCS") as a starting material. Alternatively, p-type semiconductor layer 37 may be grown under a reduced pressure using dichlorosilane (hereinafter referred to as "DCS") as a starting material. When TCS or DSC is used, the epitaxial growth rate is 0.3 to 3 μm/min.

Figure 32:
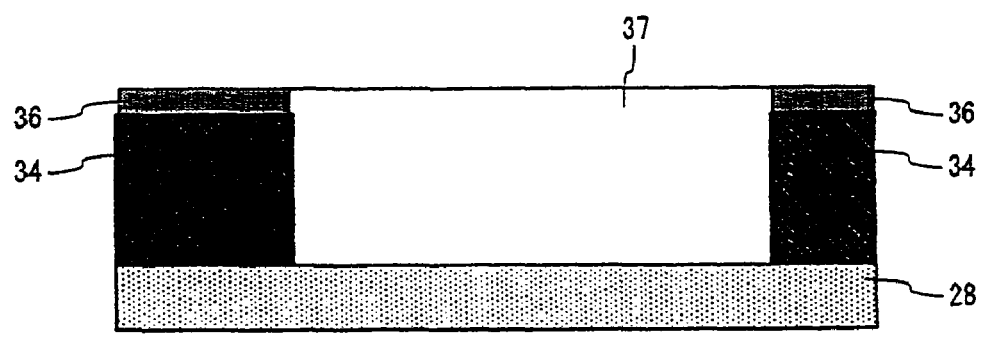
FIG. 32 is a fourth cross sectional view of the semiconductor device shown in FIG. 28 during manufacturing.

The portion of semiconductor layer 37 rising from the surface of mask 36 is removed, for example, by chemical mechanical polishing (hereinafter referred to as "CMP") (FIG. 32). In CMP, a slurry exhibiting a high selection ratio of silicon and silicon oxide (silicon/silicon oxide) is used so that the oxide film for mask 36 works as a stopper. For example, a very pure colloidal silica slurry (Planerlite-6103 supplied from Fujimi Incorporated) may be used. Typical polishing conditions include a top ring pressure set at 300 to 600 hPa and a table rotating rate of 50 to 100 rpm. The selection rate of silicon and silicon oxide is as high as 100 under the conditions described above. Thermal oxidation may be conducted prior to the CMP.

Figure 33:
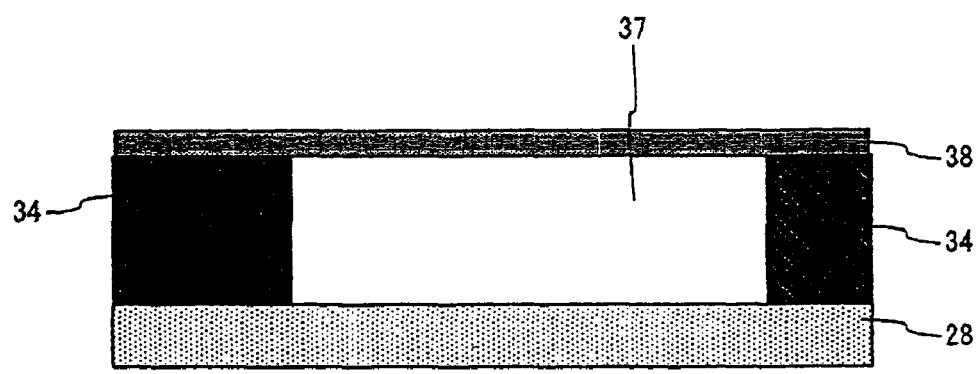
FIG. 33 is a fifth cross sectional view of the semiconductor device shown in FIG. 28 during manufacturing.

Thermal oxidation is conducted. Since the oxidation rate of p-type semiconductor layer 37 is faster than the oxidation rate of the oxide film used for mask 36 in the thermal oxidation, oxide film 38 is formed uniformly over the entire surfaces of p-type semiconductor layer 37 and the oxide film used for mask 36 (FIG. 33). Preferably, oxide film 38 is 800 nm in thickness.

Oxide film 38 is removed by etching employing HF wet cleaning. Without conducting the thermal oxidation step described with reference to FIG. 33, the oxide film used for mask 36 may be removed during trench etching using HF. In this case, however, a step as high as the thickness of mask 36 (e.g., 0.4 μm) is caused between the surface of n-type semiconductor layer 34 and the surface of p-type semiconductor layer 37. By conducting the thermal oxidation step described with reference to FIG. 33, a flat surface that includes no step is obtained on the area, from which oxide film 38 has been removed.

Figure 34:
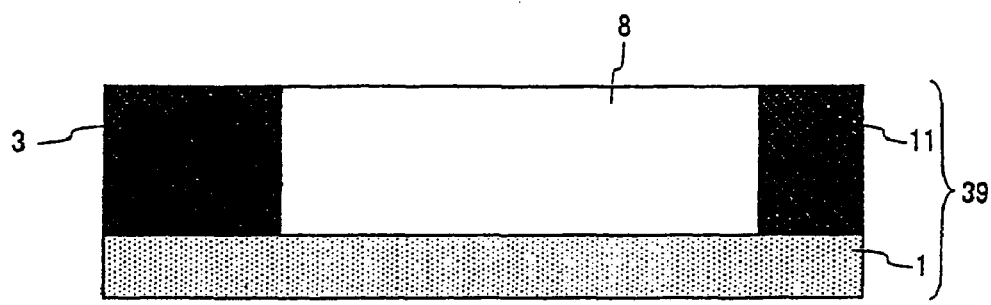
FIG. 34 is a sixth cross sectional view of the semiconductor device shown in FIG. 28 during manufacturing.

Thus, epitaxial wafer 39 including n-type semiconductor substrate layer 1, n-type drift layer 3 on substrate layer 1, n-type pillar region 11 on substrate layer 1, and p-type partition region 8 on substrate layer 1 is obtained (FIG. 34).

Using epitaxial wafer 39, a gate oxide film, a gate electrode, field plates 13 and 14, p-type base/body region 5, a source region, n-type channel stopper region 10, interlayer insulator film 15, source electrode 6, and channel stopper electrode 16 are formed in the same manner as in the first embodiment (cf. FIGS. 10 through 12). Further, passivation film 17 and drain electrode 7 are formed.

Thus, active section 200 of a super-junction MOSFET as shown in FIG. 28 and edge terminating section 300 of the super-junction MOSFET having a multilevel field plate structure and a channel stopper structure are completed.

Finally, the wafer is cut by a dicer into chips between adjacent channel stopper electrodes 16, between which no semiconductor layer is formed, and individual MOSFETs are completed.

Planar Shape of the p-type Partition Region in the Edge Terminating Section

Figure 35:
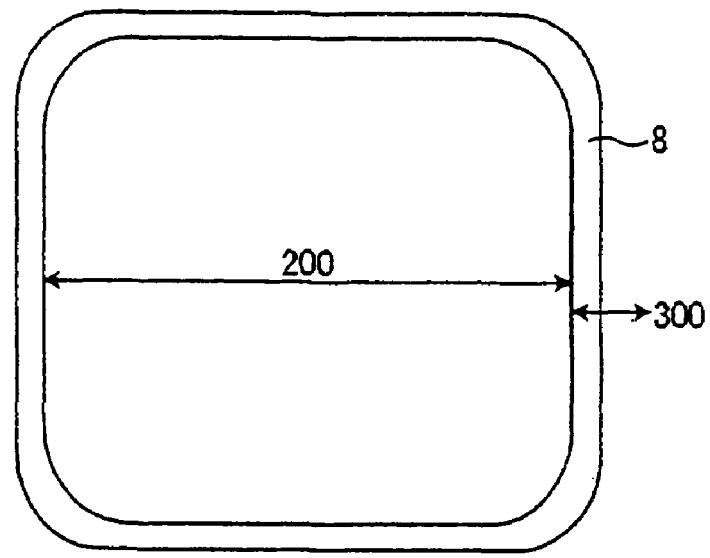
FIG. 35 is a top plan view of the p-type partition region in the edge terminating section.
Figure 36:
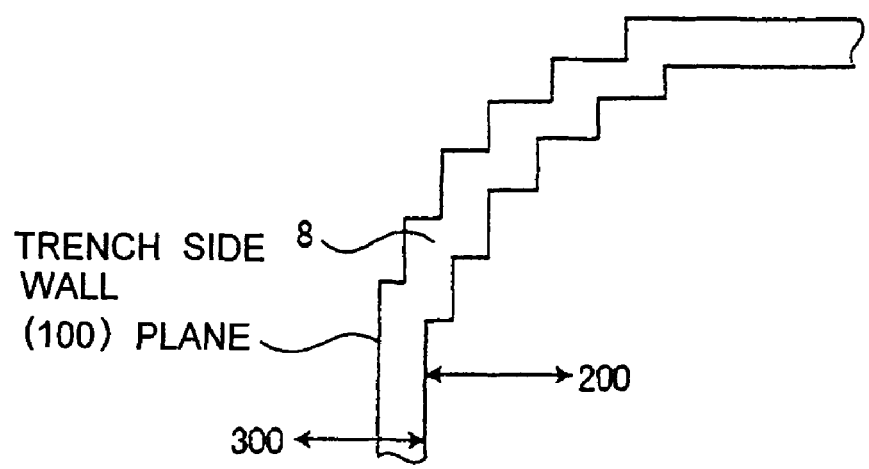
FIG. 36 is an expanded view showing the corner portion of the p-type partition region in the edge terminating section.

FIG. 35 is a top plan view of the p-type partition region in the edge terminating section. FIG. 36 is an expanded view showing the corner portion of the p-type partition region in the edge terminating section.

Referring now to FIG. 35, p-type partition region 8 is arranged such that p-type partition region 8 surrounds the side walls of active section 200. When the corner portion width of p-type partition region 8 is the same as the straight portion width of p-type partition region 8, electric field localization hardly occurs in edge terminating section 300. Therefore, it is ideal for p-type partition region 8 to have the same width in the corner portions as in the straight portions.

In growing p-type semiconductor layer 37 that will be p-type partition region 8 in an epitaxial manner in trench 35, the growth rate is the highest when the trench side wall coincides with the (100) plane. When the trench side wall does not coincide with the (100) plane, the growth rate is low. Therefore, if the epitaxial growth is conducted with the plane orientation of the trench side wall in the straight portion of p-type partition region 8 set at (100), the epitaxial growth rate in the corner portion of p-type partition region 8 will be low, since the plane orientation of the trench side wall in the corner portion of p-type partition region 8 is not (100).

Due to the reason described above, it takes a long time to completely fill trench 35 with p-type semiconductor layer 37. To obviate the problem described above, the portion of trench 35 in the corner portion of p-type partition region 8 is not shaped with an arc but rather steps as illustrated in FIG. 36. The epitaxial growth rate in the step-shaped portion of trench 35 is higher than the epitaxial growth rate in the arc-shaped portion of trench 35 in the corner portion of p-type partition region 8. Since trench 35, the portion thereof in the corner portion of p-type partition region 8 is shaped with steps, is filled with p-type partition region 8 in a short time, the throughput of completed non-defective products is improved and, therefore, the productivity is improved.

Comparison with Conventional Semiconductor Device

Figure 37:
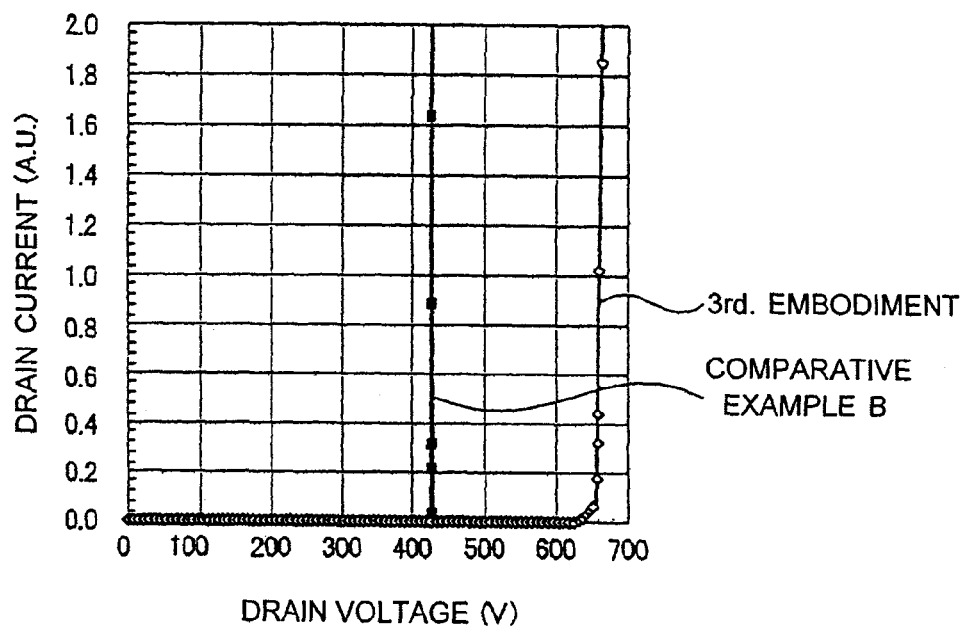
FIG. 37 is a couple of curves describing the simulated breakdown voltages.
Figure 38:
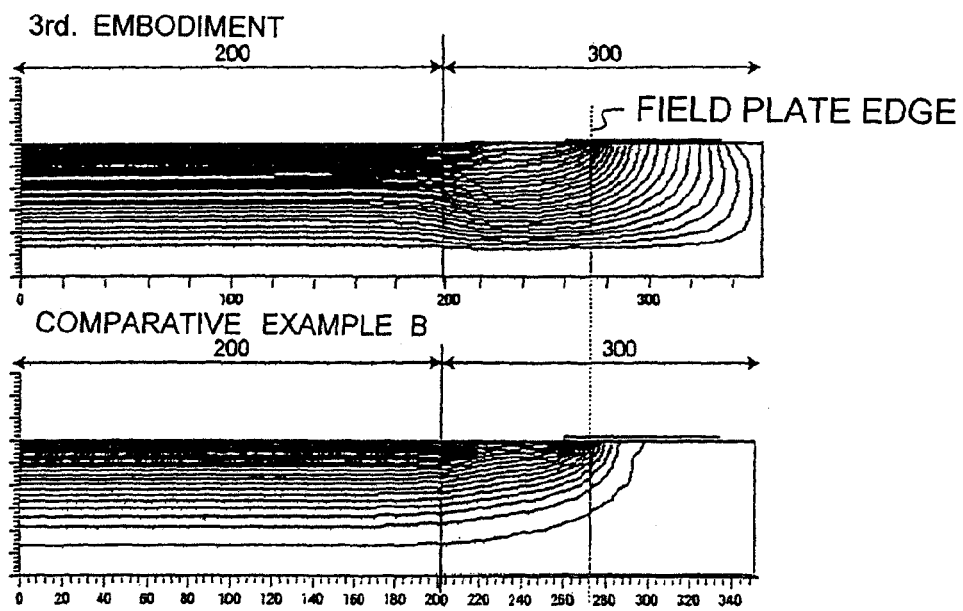
FIG. 38 compares the simulated potential distributions when avalanche breakdown is caused.
Figure 39:
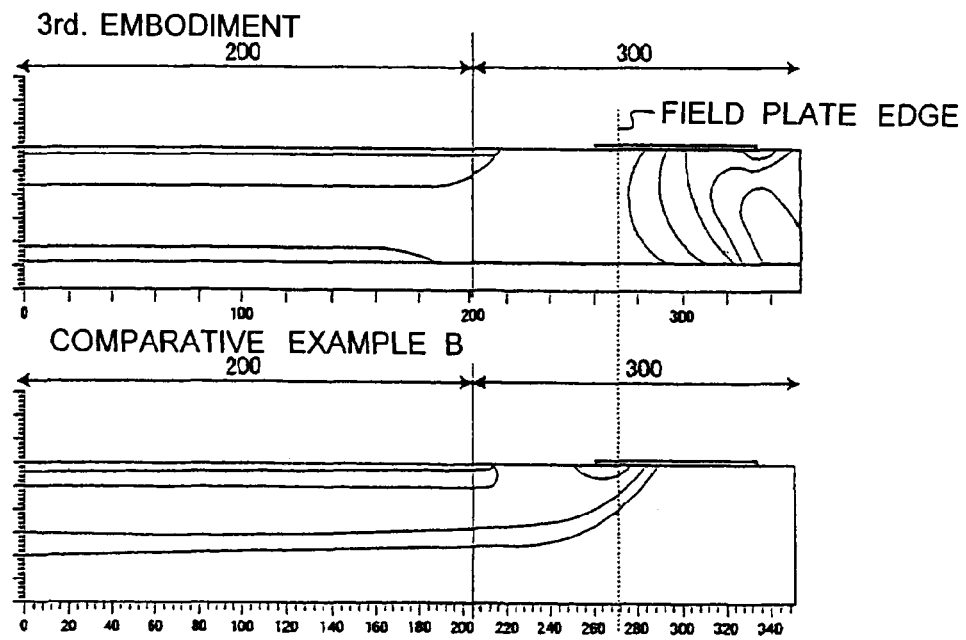
FIG. 39 compares the simulated electric field distributions when avalanche breakdown is caused.
Figure 40:
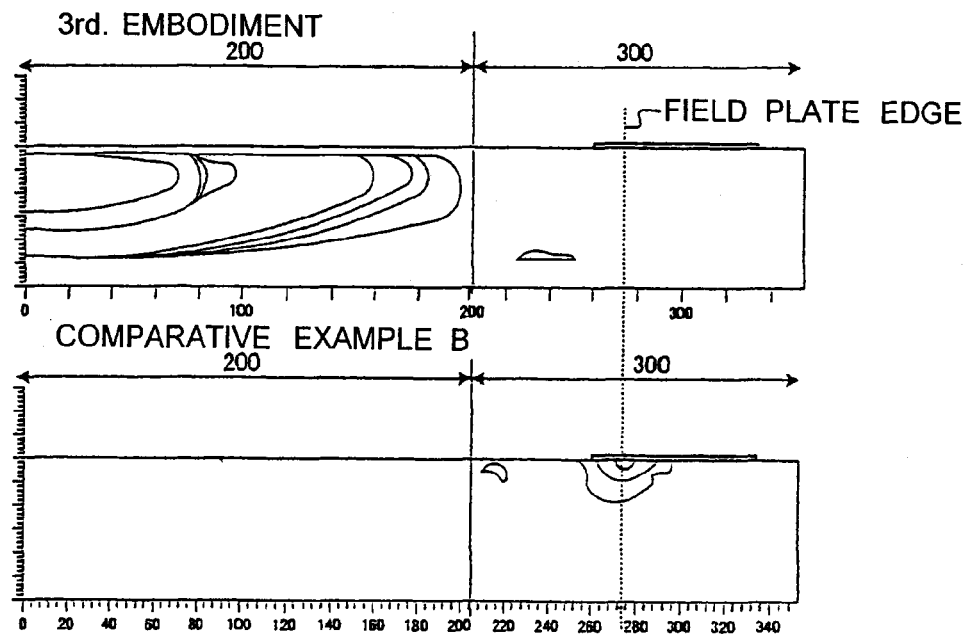
FIG. 40 compares the impact ionization rates when avalanche breakdown is caused.
Figure 41:
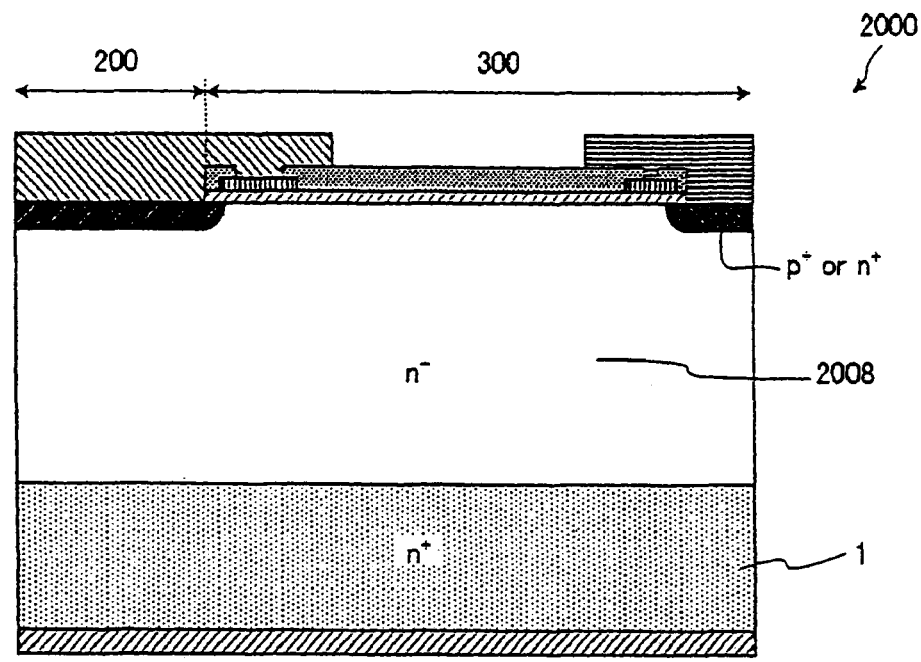
FIG. 41 is a cross sectional view of a conventional semiconductor device employed in FIGS. 37 through 40 for comparison with the semiconductor device according to the third embodiment.

FIG. 37 includes two curves describing the simulated breakdown voltages for the semiconductor device according to the third embodiment of the invention and a super-junction semiconductor device having a conventional structure (hereinafter referred to as a "comparative example B"). FIG. 38 compares the simulated potential distributions when avalanche breakdown is caused. FIG. 39 compares the simulated electric field distributions when avalanche breakdown is caused. FIG. 40 compares the impact ionization rates when avalanche breakdown is caused. FIG. 41 is a cross sectional view of a semiconductor device according to the comparative example B. In FIG. 41, semiconductor device 2000 according to the comparative example B is different from semiconductor device 120 according to the third embodiment of the invention only in that the conductivity type of semiconductor region 2008 in edge terminating section 300 is an n-type.

As FIG. 37 indicates, semiconductor device 120 according to the third embodiment exhibits an avalanche breakdown voltage higher than the avalanche breakdown voltage of semiconductor device 2000 according to the comparative example B.

Equipotential surfaces curve sharply on the field plate edge in semiconductor device 120 according to the third embodiment and in the semiconductor device according the comparative example B as described in FIG. 38. It is estimated that the electric field strength is high in the portions in which the equipotential surfaces curve sharply.

However, as FIG. 39 indicates, the electric field strength on the field plate edge in semiconductor device 120 according to the third embodiment is lower than the electric field strength on the field plate edge in the semiconductor device according to the comparative example B.

The main junction plane that sustains the breakdown voltage is the boundary between n-type semiconductor substrate 1 and p-type partition section 8 in edge terminating section 300 in semiconductor device 120 according to the third embodiment. The electric field strength lowers toward the first major surface, beneath which p-type base/body region 5 is formed.

Since semiconductor region 2008 in semiconductor device 2000 according to the comparative example B is an n-type one, the main junction plane that sustains the breakdown voltage is the surface portion of n-type semiconductor region 2008, i.e., the plane on which p-type base/body region 5 is formed. Therefore, the multiplier effect of the electric field strength rise on the flat junction plane and the formation of a high-electric-field portion caused by electric field localization is caused in semiconductor device 2000 according to the comparative example B.

As FIG. 40 indicates, the impact ionization rate is high on the edge of the field plate on the second level in semiconductor device 2000 according to the comparative example B. Therefore, it is indicated that the breakdown voltage is determined by the second-level field plate edge. In contrast, the impact ionization rate is high in active section 200 in semiconductor device 120 according to the third embodiment. Therefore, it is indicated that the designed breakdown voltage of the main pn-junctions in active section 200 is secured in semiconductor device 120.

The electric field distribution in edge terminating section 300 in semiconductor device 120 according to the third embodiment is almost the same as that in semiconductor device 100 according to the first embodiment. Therefore, no multiplier effect as caused in conventional semiconductor device 2000 is caused in semiconductor device 120, even when a high-electric-field portion is caused by electric field localization on the p-type base region side of epitaxial wafer 39.

Therefore, the designed breakdown voltage of the main pn-junctions in active section 200 is secured in semiconductor device 120 according to the third embodiment.

Fourth Embodiment

Semiconductor Device Structure

Figure 42:
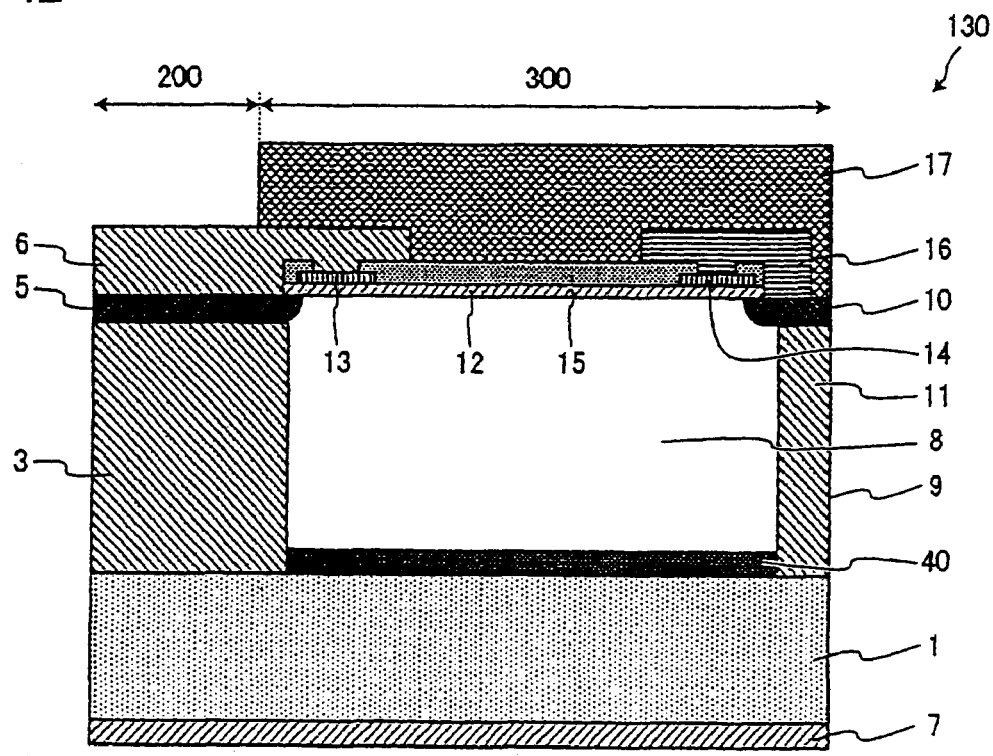
FIG. 42 is a cross sectional view of a semiconductor device according to a fourth embodiment of the invention.

FIG. 42 is a cross sectional view of a semiconductor device according to a fourth embodiment of the invention.

As shown in FIG. 42, semiconductor device 130 according to the fourth embodiment is a modification of semiconductor device 120 according to the third embodiment. Semiconductor device 130 according to the fourth embodiment is different from semiconductor device 120 according to the third embodiment in that oxide film layer 40 made of a silicon oxide insulator film of several hundreds nm to a thousand and several hundreds nm in thickness is disposed between n-type semiconductor substrate layer 1 and p-type partition region 8 in edge terminating section 300 in semiconductor 130. Since the other structure is the same as that in the semiconductor device according to the third embodiment, the descriptions thereof will not be repeated.

Method of Manufacturing the Semiconductor Device

Now a method of manufacturing semiconductor device 130 will be described below. A method of manufacturing a super-junction MOSFET exhibiting a breakdown voltage of 600 V will be described as an example below mainly in connection with the construction of edge terminating section 300 thereof. FIGS. 43 through 48 are cross sectional views of semiconductor device 130 during manufacturing.

A semiconductor wafer including n-type semiconductor substrate layer 1, active section 200, edge terminating section 300, and a region having scribe plane 9 of semiconductor device 120 is formed. In active section 200, n-type drift region 3 is formed on n-type semiconductor substrate layer 1. In edge terminating section 300, p-type partition region 8 is formed above n-type semiconductor substrate layer 1. In the region having scribe plane 9 of semiconductor device 120, n-type pillar region 11 is formed on n-type semiconductor substrate layer 1.

Now a simple and easy method for forming the semiconductor wafer described above will be described below with reference to FIGS. 43 through 48.

Figure 43:
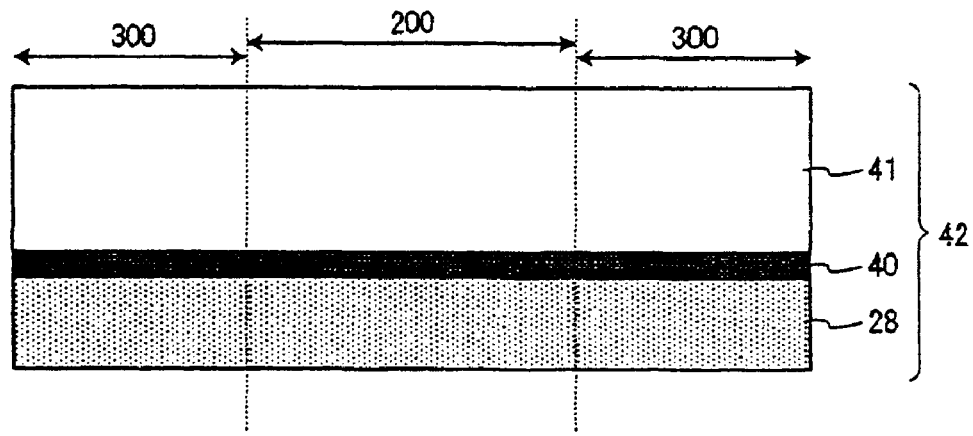
FIG. 43 is a first cross sectional view of the semiconductor device shown in FIG. 42 during manufacturing.

First, SOI wafer 42 including n-type Si semiconductor substrate 28, p-type semiconductor layer 41, and oxide film layer 40 between n-type Si semiconductor substrate 28 and p-type semiconductor layer 41 is prepared (FIG. 43). Si semiconductor substrate 28 contains $2.0 \times 10^{18}$ cm$^{-3}$ of antimony. Semiconductor layer 41 contains $1.0 \times 10^{14}$ cm$^{-3}$ of boron. Oxide film layer 40 is several hundred µm in thickness. It is preferable to adjust the thickness of p-type semiconductor layer 41 at the desired thickness of n-type drift region 3.

Figure 44:
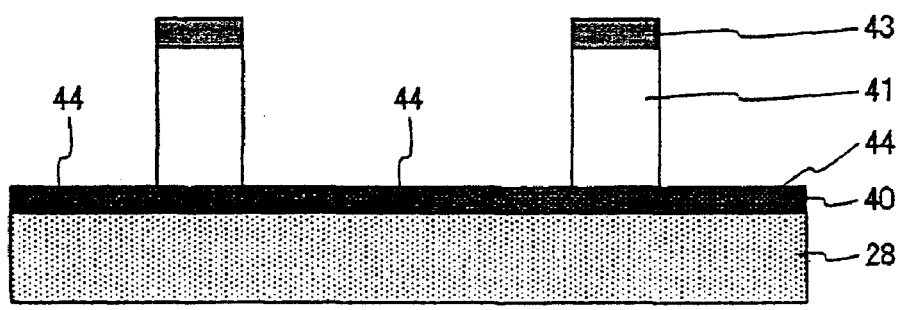
FIG. 44 is a second cross sectional view of the semiconductor device shown in FIG. 42 during manufacturing.

An oxide film having a predetermined thickness is grown on p-type semiconductor layer 41 by thermal oxidation. The portions of the oxide film corresponding to active section 200 and n-type pillar region 11 are opened to form mask 43. Trenches 44 are formed using mask 43 by the trench etching technique known to the ordinary skilled person in the art (FIG. 44). By anisotropic dry etching or by anisotropic wet etching of SOI wafer 42 having {111} planes, the side wall angle of trench 44 is set at 90° or almost at 90° with respect to the major surface of n-type Si semiconductor substrate 28.

Figure 45:
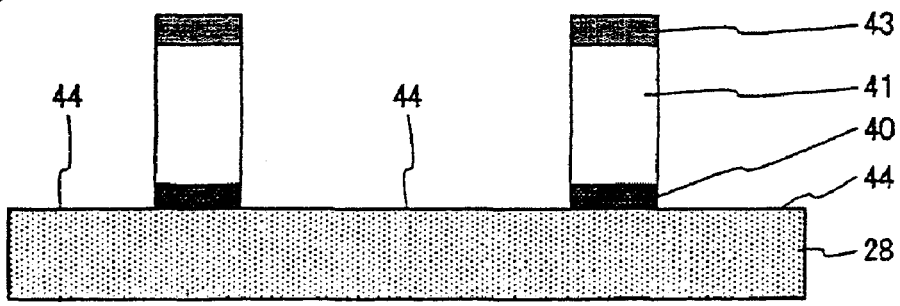
FIG. 45 is a third cross sectional view of the semiconductor device shown in FIG. 42 during manufacturing.
Figure 46:
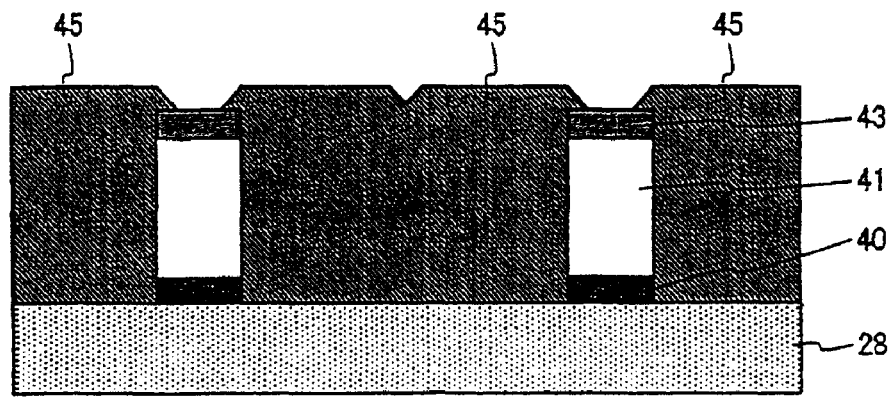
FIG. 46 is a fourth cross sectional view of the semiconductor device shown in FIG. 42 during manufacturing.
Figure 47:
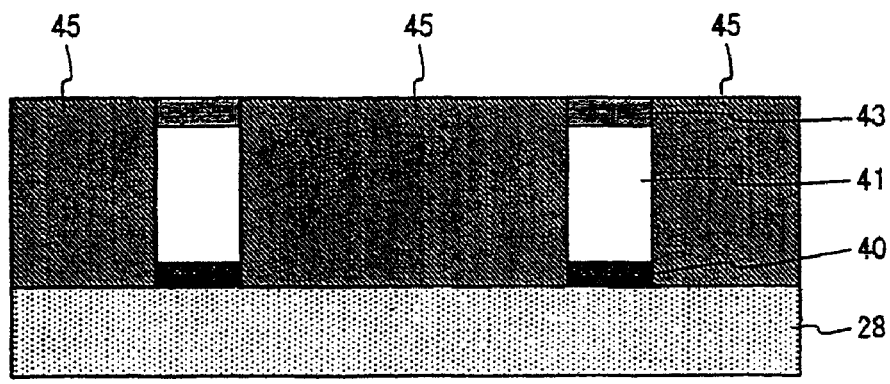
FIG. 47 is a fifth cross sectional view of the semiconductor device shown in FIG. 42 during manufacturing.

Oxide film layer 40 remaining in the bottom of trench 44 is removed (FIG. 45). Oxide film layer 40 remains between p-type semiconductor layer 41, which has survived the trench etching, and n-type Si semiconductor substrate 28. N-type semiconductor layer 45 containing $2.5 \times 10^{14}$ cm$^{-3}$ of phosphorus is grown in an epitaxial manner in trench 44 (FIG. 46).

The portion of n-type semiconductor layer 45 rising from the surface of mask 43 is planed, for example, by CMP employing the oxide film used for mask 43 for a stopper (FIG.

47). Thermal oxidation may be conducted prior to the CMP. An oxide film having a uniform thickness of around 800 nm is formed by thermal oxidation on the entire surfaces of n-type semiconductor layer 45 and the oxide film used for mask 43. By removing the thermal oxide film, a flat surface having no step is obtained.

Figure 48:
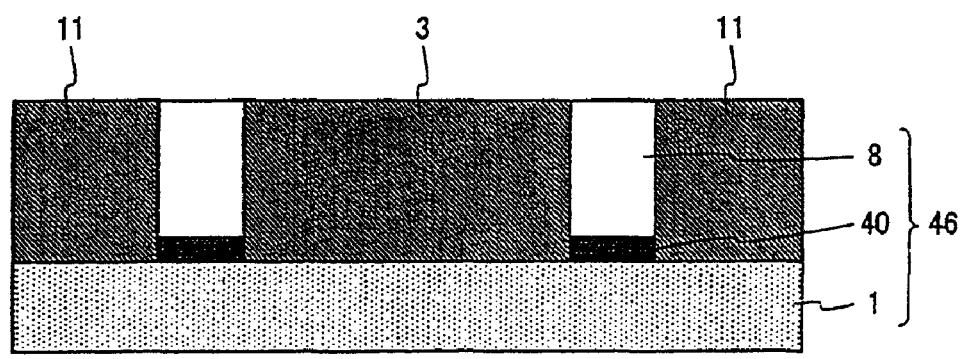
FIG. 48 is a sixth cross sectional view of the semiconductor device shown in FIG. 42 during manufacturing.

Thus, partial SOI wafer 46, including n-type semiconductor substrate layer 1, n-type drift region 3 on substrate layer 1, n-type pillar region 11 on substrate layer 1, oxide film layer 40 on substrate layer 1, and p-type partition region 8 on oxide film layer 40, is formed (FIG. 48).

Using partial SOI wafer 46, a gate oxide film, a gate electrode, field plates 13 and 14, p-type base/body region 5, a source region, n-type channel stopper region 10, interlayer insulator film 15, source electrode 6, and channel stopper electrode 16 are formed in the same manner as in the first embodiment (cf. FIGS. 10 through 12). Further, passivation film 17 and drain electrode 7 are formed.

Thus, active section 200 of a MOSFET as shown in FIG. 42 and edge terminating section 300 of the MOSFET having a multilevel field plate structure and a channel stopper structure are completed.

Finally, the wafer is cut by a dicer into chips between adjacent channel stopper electrodes 16, between which no semiconductor device 130 is formed, and individual MOSFETs are completed.

The electric field distribution in edge terminating section 300 of semiconductor device 130 according to the fourth embodiment is almost the same as that in semiconductor device 100 according to the first embodiment. Therefore, no multiplier effect as caused in the conventional semiconductor device is caused in semiconductor device 130, even when a high-electric-field portion is caused on the p-type base region side of partial SOI wafer 46. Therefore, the designed breakdown voltage of the main pn-junctions in active section 200 is secured in semiconductor device 130. The thickness of n-type drift region 3 according to the fourth embodiment is more precise than that according to the third embodiment. In substitution for oxide film layer 40, a lightly doped n-type layer doped more lightly than n-type semiconductor substrate layer 1 may be disposed between n-type semiconductor substrate layer 1 and p-type partition region 8 in edge terminating section 300 with no problem.

Fifth Embodiment

Semiconductor Device Structure

Figure 49:
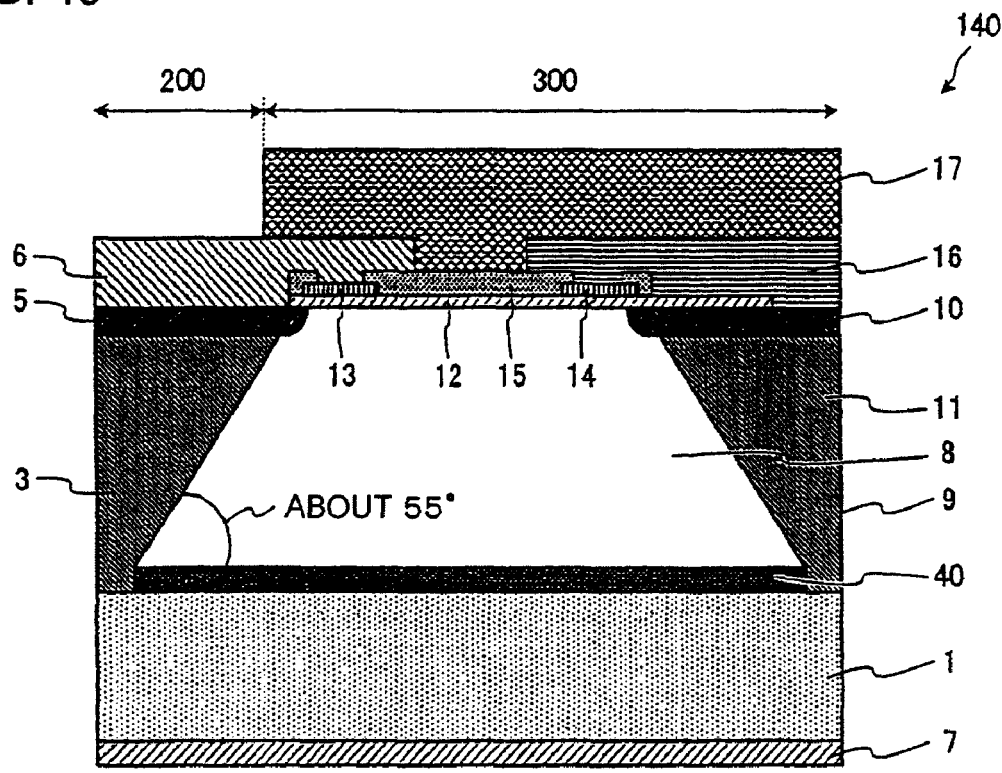
FIG. 49 is a cross sectional view of a semiconductor device according to a fifth embodiment of the invention.

FIG. 49 is a cross sectional view of a semiconductor device according to a fifth embodiment of the invention. As shown in FIG. 49, semiconductor device 140 according to the fifth embodiment is a modification of semiconductor device 130 according to the fourth embodiment. Semiconductor device 140 is different from semiconductor device 130 in that p-type partition region 8 in edge terminating section 300 becomes wider from the side of the field plate structure to the side of n-type semiconductor substrate layer 1.

The boundary between n-type drift region 3 in active section 200 and p-type partition region 8 and the boundary between n-type pillar region 11 and p-type partition region 8 slant at 55° or almost at 55° with the major surface of n-type semiconductor substrate layer 1. On the boundaries, n-type drift region 3 and n-type pillar region 11 are over p-type partition region 8. Since the other structure is the same as that in the semiconductor device according to the fourth embodiment, the descriptions thereof will not be repeated.

Method of Manufacturing the Semiconductor Device

Semiconductor device 140 is manufactured in the same manner as semiconductor device 130. However, in the trench formation step described in connection with the fourth embodiment, trench 44 for semiconductor device 140 according to the fifth embodiment is formed such that side walls of trench 44 slant at 55° or almost at 55° with the major surface of type Si semiconductor substrate 28. The side walls of trench 44 are made to slant at 55° or almost at 55° with the major surface of n-type Si semiconductor substrate 28 by etching SOI wafer 42 having {111} planes by anisotropic wet etching, by which a slanting angle of 54.7° is obtained. The semiconductor device according to the fifth embodiment exhibits the same advantages as those of the semiconductor device according to the fourth embodiment.

Sixth Embodiment

Semiconductor Device Structure

Figure 50:
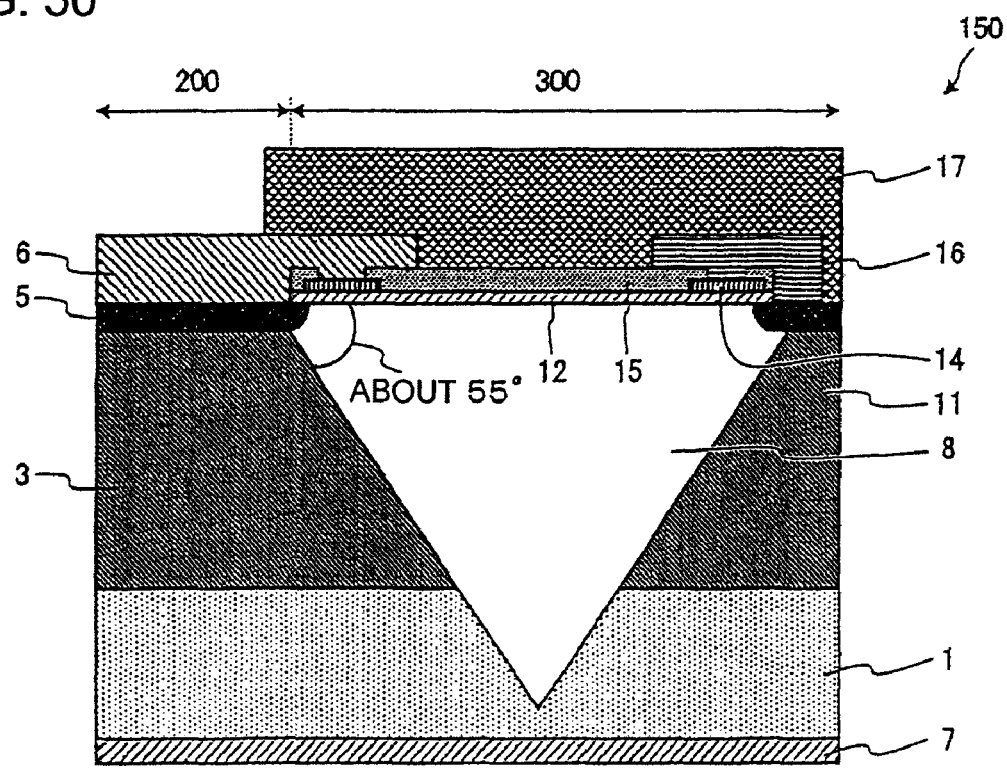
FIG. 50 is a cross sectional view of a semiconductor device according to a sixth embodiment of the invention.

FIG. 50 is a cross sectional view of a semiconductor device according to a sixth embodiment of the invention. As shown in FIG. 50, semiconductor device 150 according to the sixth embodiment is a modification of semiconductor device 120 according to the third embodiment. Semiconductor device 150 is different from semiconductor device 120 in that edge terminating section 300 includes a semiconductor layer including p-type partition region 8, the extended portion of n-type drift region 3 extended from active section 200, and n-type pillar region 11.

The boundary plane between n-type drift region 3 and p-type partition region 8 and the boundary plane between n-type pillar region 11 and p-type partition region 8 are positioned in edge terminating section 300. The boundary plane between n-type drift region 3 and p-type partition region 8 and the boundary plane between n-type pillar region 11 and p-type partition region 8 slant at 55° or almost at 55° with the major surface of the semiconductor layer including p-type partition region 8, n-type drift region 3, and p-type base/body region 5. Across the boundary planes, p-type partition region 8 is over n-type drift region 3 and n-type pillar region 11. Partition region 8 is extended into n-type semiconductor substrate layer 1. Since the other structure is the same with that in the semiconductor device according to the third embodiment, the descriptions thereof will not be repeated.

Method of Manufacturing the Semiconductor Device

Now a method of manufacturing semiconductor device 150 will be described below. A method of manufacturing a super-junction MOSFET exhibiting a breakdown voltage of 600 V will be described as an example below mainly in connection with the construction of edge terminating section 300 thereof. FIGS. 51 through 55 are cross sectional views of semiconductor device 150 during manufacturing.

A semiconductor wafer is formed which includes n-type semiconductor substrate layer 1, on which n-type drift region 3, p-type partition region 8, and n-type pillar region 11 are formed. Drift region 3, partition region 8, and pillar region 11 are shaped with respective cross sectional shapes described above.

Now a simple and easy method for forming the semiconductor wafer described above will be described below with reference to FIGS. 51 through 55.

First, n-type semiconductor layer 34 containing $2.5 \times 10^{14}$ cm$^{-3}$ of phosphorus is grown on n-type Si semiconductor substrate 28 containing $2.0 \times 10^{18}$ cm$^{-3}$ of antimony (cf. FIG. 29). According to the sixth embodiment, a substrate having {100} planes is used for n-type Si semiconductor substrate 28.

Figure 51:
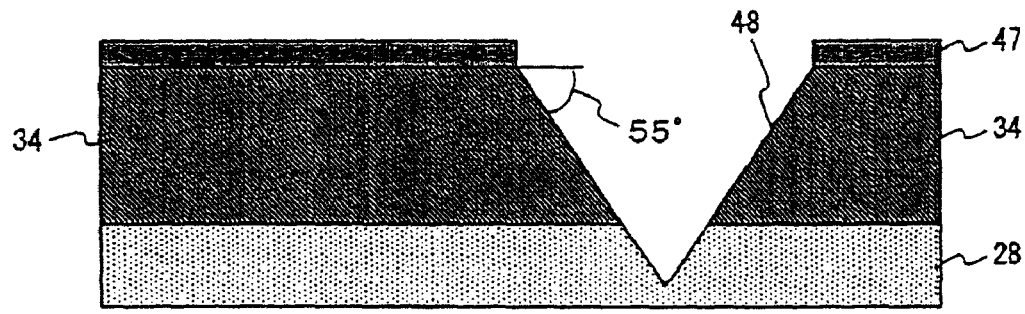
FIG. 51 is a first cross sectional view of the semiconductor device shown in FIG. 50 during manufacturing.

An oxide film having a predetermined thickness is grown on n-type semiconductor layer 34 by thermal oxidation. Mask 47 is formed by forming an opening in the portion of the oxide film corresponding to edge terminating section 300. Then, trench 48 having a cross section shaped with a letter V (hereinafter referred to as a "V-trench") is formed in n-type semiconductor layer 34 by anisotropic wet etching using tetramethyl-ammonium hydroxide (hereinafter referred to as "TMAH") so that {111} planes may be exposed (FIG. 51).

V-trench 48 has side walls slanting at 54.7° (almost 55°) with the substrate surface. The bottom of V-trench 48 may be positioned above or in n-type Si semiconductor substrate 28 with no problem. For securing an appropriate etching rate and for preventing micro pyramids from causing, etching is conducted at 80° C. using an aqueous solution containing 10 wt. % of TMAH. The etching rate under the conditions described above is 0.5 μm/min.

In the etching using a TMAH aqueous solution, the etching rate of the (111) plane is abut 1/100 the etching rates of the (100) and (110) planes. Therefore, the (111) plane is formed naturally. As soon as the (111) plane is completed, etching does not almost proceed anymore. Therefore, the V-trench is formed with an excellent reproducibility.

When the opening width of the oxide film is 100 μm, V-trench 48 is about 70 μm in depth. Since the etching rate ratio of the silicon semiconductor substrate and the thermal oxide film is as large as 10000, the thermal oxide film is etched only for several nm in forming the V-trench. Therefore, the thermal oxide film for the anisotropic wet etching may be thinner than the thermal oxide film for the RIE anisotropic etching, and, for example, 100 nm in thickness with no problem.

Figure 52:
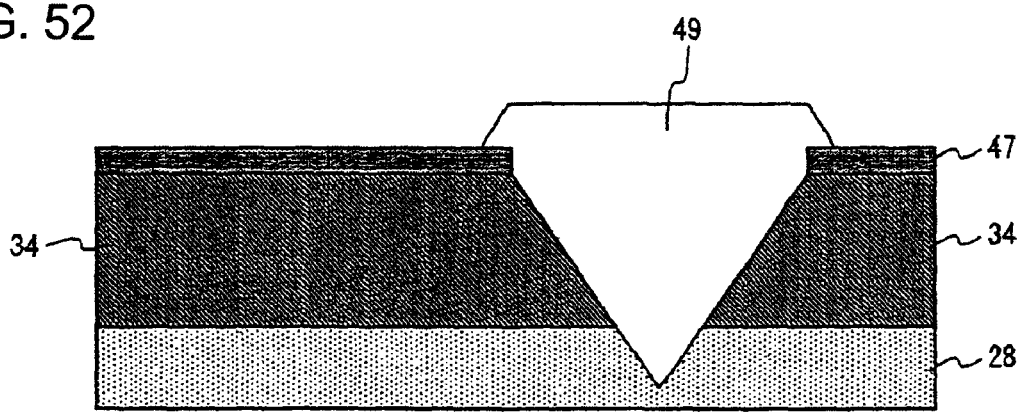
FIG. 52 is a second cross sectional view of the semiconductor device shown in FIG. 50 during manufacturing.

P-type semiconductor layer 49 containing $1.0 \times 10^{14}$ cm$^{-3}$ of boron is grown in V-trench 48 in an epitaxial manner (FIG. 52). Trichlorosilane or dichlorosilane is used for a starting material of silicon. Diborane ($B_2H_6$) is used for a dopant gas. By feeding hydrogen chloride (HCl) together with the starting material gas and the dopant gas, polysilicon is prevented from growing on the oxide film but grown in an epitaxial manner only in V-trench 48. The epitaxial growth technique described above facilitates filling V-trench 48 with a high quality and making the CMP conducted later flatten the semiconductor wafer surface easily.

The growth temperature is preferably from 950° C. to 1100° C. for securing the epitaxial growth rate of 0.3 to 3 m/min. The growth temperature of 950° C. to 1100° C. is also preferably to prevent voids from causing in filling V-trench 48 with the epitaxial layer. If the trench side walls extend perpendicularly to the substrate surface, the trench opening may be closed during filling the trench with the epitaxial layer, affecting the device characteristics and the manufacturing steps adversely.

Figure 53:
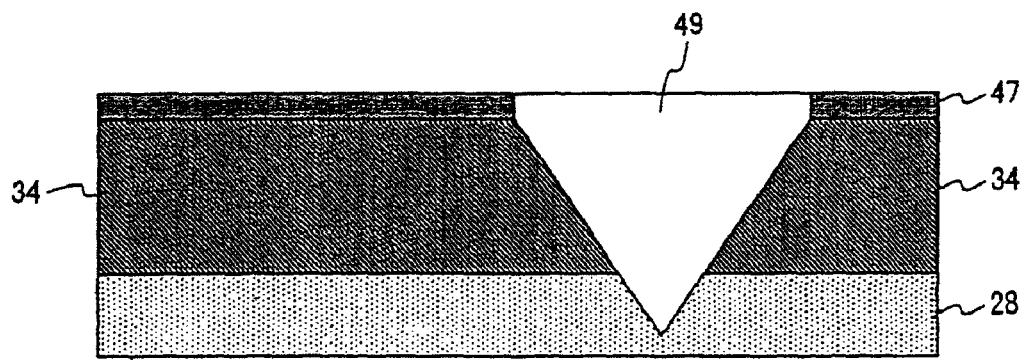
FIG. 53 is a third cross sectional view of the semiconductor device shown in FIG. 50 during manufacturing.
Figure 54:
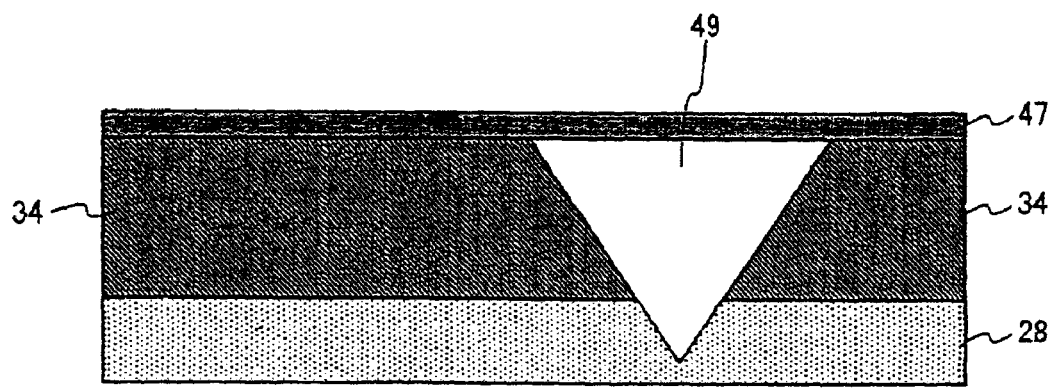
FIG. 54 is a fourth cross sectional view of the semiconductor device shown in FIG. 50 during manufacturing.

The portion of p-type semiconductor layer 49 rising from the surface of mask 47 is planed, for example, by CMP (FIG. 53). In the CMP, a slurry exhibiting a very high etching selection ratio of silicon and the oxide film is used so that the oxide film used for mask 47 may work as a stopper. For example, a very pure colloidal silica slurry (Planerlite-6103 supplied from Fujimi Incorporated) is used. Typical polishing conditions include a top ring pressure set at 300 to 600 hPa and a table rotating rate of 50 to 100 rpm. Under the conditions described above, the selection ratio of silicon and the oxide film (silicon/oxide film) is as high as 100. Thermal oxidation may be conducted prior to the CMP.

An oxide film having a uniform thickness of around 800 nm is formed by thermal oxidation on the entire surfaces of p-type semiconductor layer 49 and the oxide film used for mask 47. By removing the thermal oxide film, a flat surface having no step is obtained.

Figure 55:
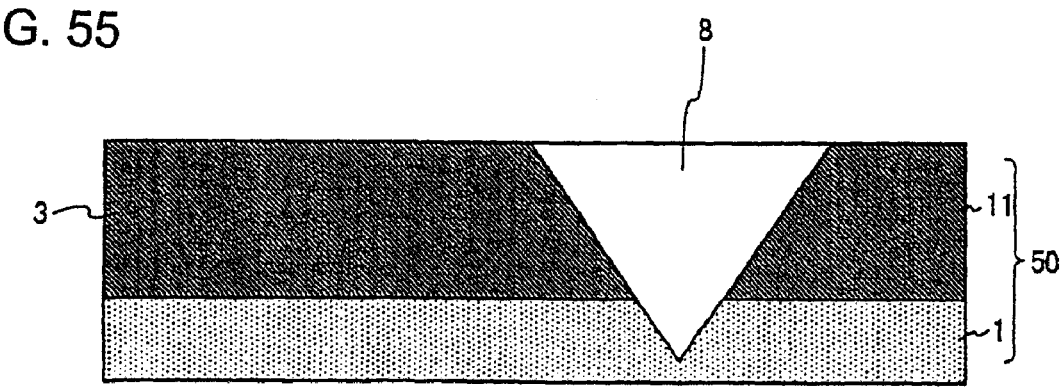
FIG. 55 is a fifth cross sectional view of the semiconductor device shown in FIG. 50 during manufacturing.

Thus, epitaxial wafer 50 including n-type semiconductor substrate layer 1, n-type drift region 3 on substrate layer 1, n-type pillar region 11 on substrate layer 1, and p-type partition region 8 on substrate layer 1 is formed (FIG. 55).

Using epitaxial wafer 50, a gate oxide film, a gate electrode, field plates 13 and 14, p-type base/body region 5, a source region, n-type channel stopper region 10, interlayer insulator film 15, source electrode 6, and channel stopper electrode 16 are formed in the same manner as in the first embodiment (cf. FIGS. 10 through 12). Further, passivation film 17 and drain electrode 7 are formed.

Thus, active section 200 of a super-junction MOSFET as shown in FIG. 50 and edge terminating section 300 of the super-junction MOSFET having a multilevel field plate structure and a channel stopper structure are completed.

Finally, the wafer is cut by a dicer into chips between adjacent channel stopper electrodes 16, between which no semiconductor device 150 is formed, and individual super-junction MOSFETs are completed.

Semiconductor device 150 according to the sixth embodiment exhibits the same advantages as those of semiconductor device 120 according to the third embodiment. Partition region 8 may be above n-type semiconductor substrate layer 1 or extended into n-type semiconductor substrate layer 1 with no problem. Still alternatively, the boundary between p-type partition region 8 and n-type drift region 3 may extend at 900 or almost at 900 with the major surfaces of p-type partition region 8, n-type drift region 3, and p-type base/body region 5.

Comparison of Diodes According to the Third Through Sixth Embodiments with a Conventional Diode Now the results of comparing the semiconductor devices according to the third through sixth embodiments including active section 200, in which a diode is formed in substitution for the MOSFET, with a conventional diode according to the comparative example B will be described below.

Figure 56:
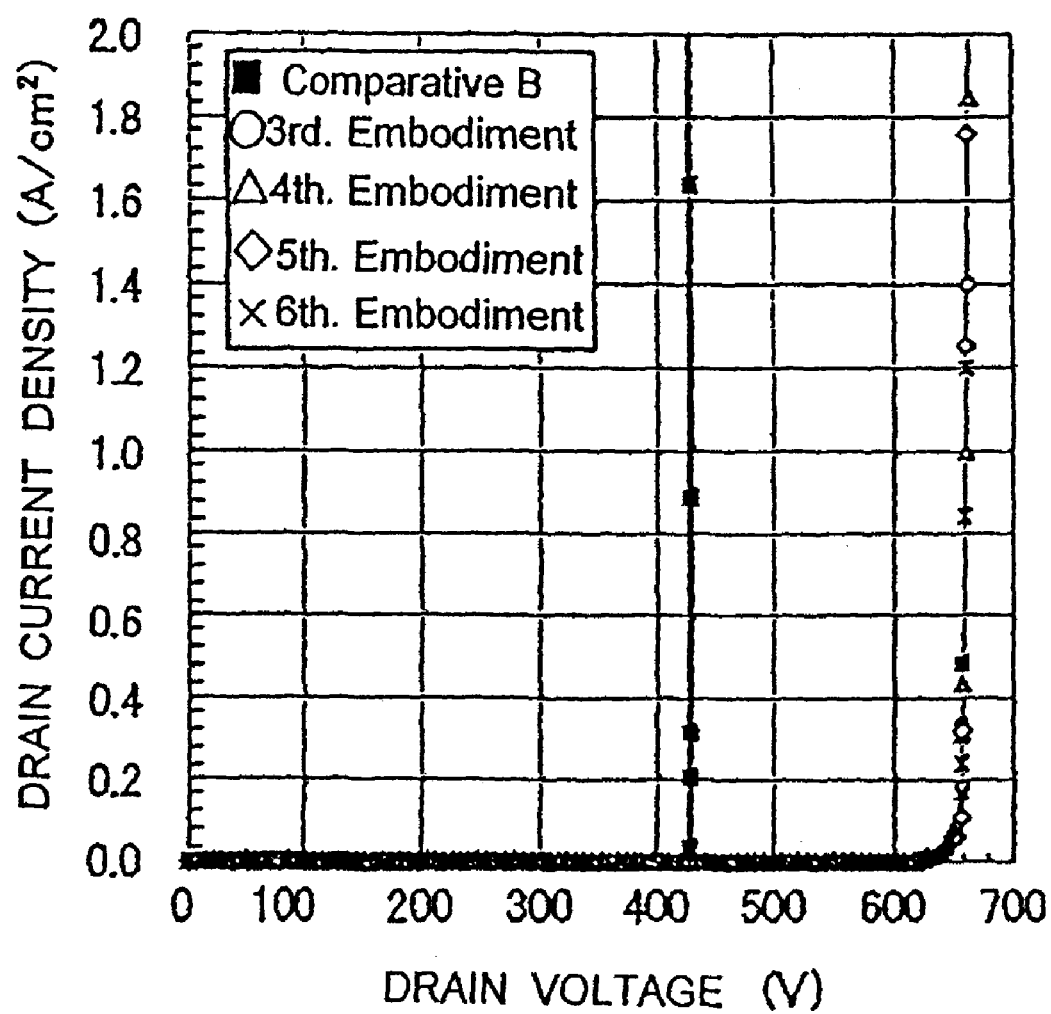
FIG. 56 described the simulated breakdown voltages simulated for the diodes according to the invention and for a conventional comparative diode.

FIG. 56 shows the simulated breakdown voltages simulated for diodes according to the third through sixth embodiments and for a conventional diode according to the comparative example B as shown in FIG. 41. As FIG. 56 indicates, the diodes according to the third through sixth embodiments exhibit a breakdown voltage higher than the breakdown voltage of the conventional diode according to the comparative example B.

Figure 57:
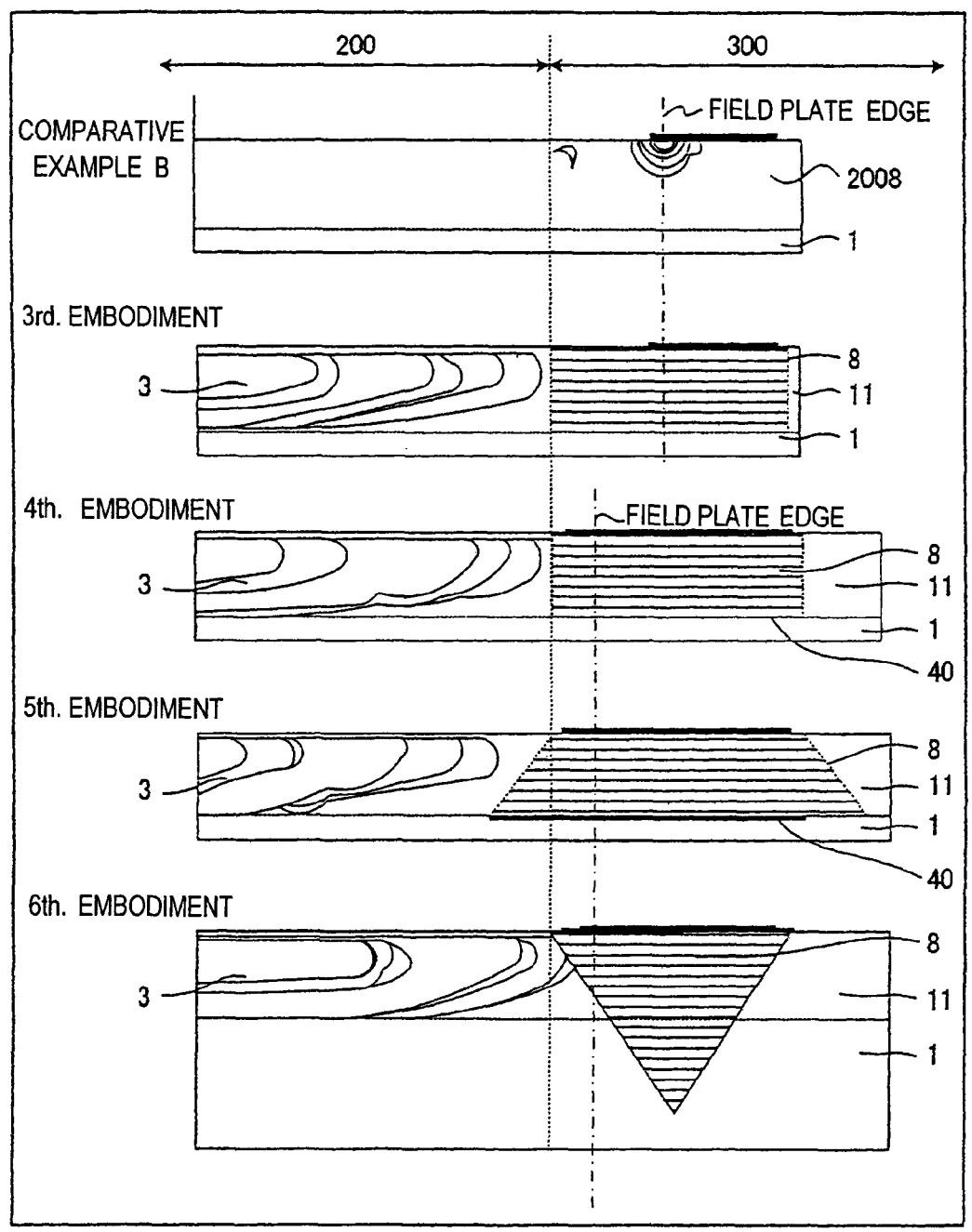
FIG. 57 describes the simulated carrier generation caused when avalanche breakdown is caused in the diodes according to the invention and in the conventional comparative diode.

FIG. 57 shows the simulated carrier generation caused when avalanche breakdown is caused in the diodes according to the third through sixth embodiments and the conventional diode according to the comparative example B. In FIG. 57, simulation results are shown for the conventional diode according to the comparative example B and for the diodes according to the third through sixth embodiments from top to down. As FIG. 57 indicates, many carriers are generated in semiconductor region 2008 (on the field plate edge) in edge terminating section 300 in the conventional diode according to the comparative example B, further indicating that avalanche breakdown is caused in edge terminating section 300.

In contrast, FIG. 57 shows that many carriers are generated in active section 200 below p-type base/body region 5 in the diodes according to the third through sixth embodiments, further indicating that avalanche breakdown is caused in active section 200. Therefore, it is indicated that the designed breakdown voltage of the main pn-junctions in active section 200 is secured in the semiconductor devices according to the third through sixth embodiments of the invention.

Seventh Embodiment

Figure 58:
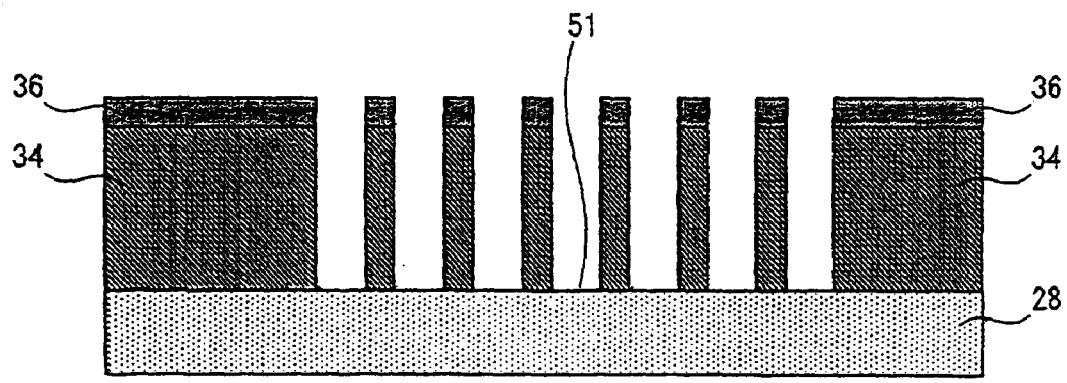
FIG. 58 is a first cross sectional view of an epitaxial wafer during manufacturing by a method according to a seventh embodiment of the invention.
Figure 59:
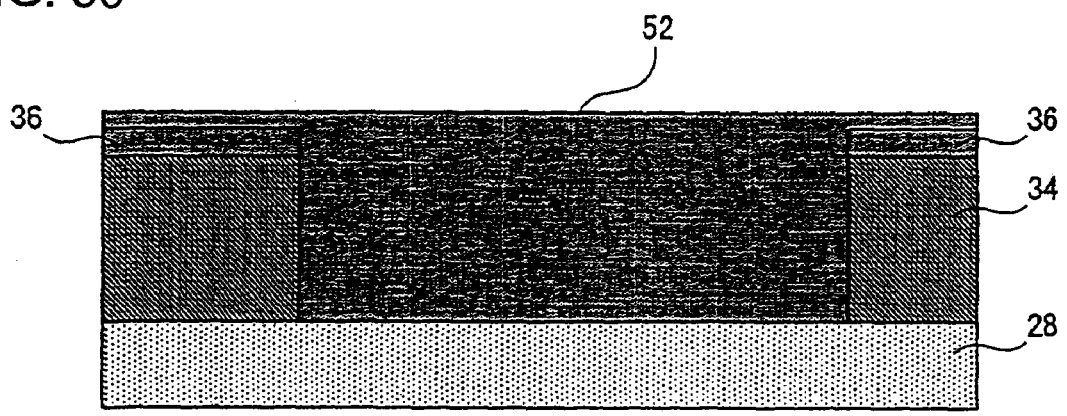
FIG. 59 is a second cross sectional view of the epitaxial wafer during manufacturing by the method according to the seventh embodiment.
Figure 60:
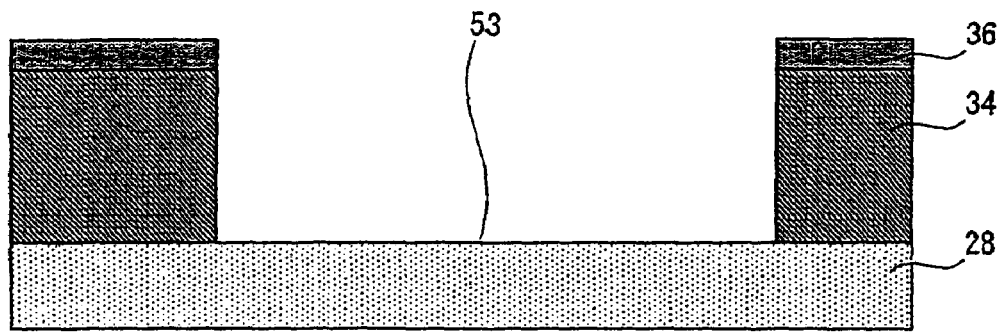
FIG. 60 is a third cross sectional view of the epitaxial wafer during manufacturing by the method according to the seventh embodiment.

Epitaxial wafer 39 according to the third embodiment is manufactured by a method according to a seventh embodiment of the invention. FIGS. 58 through 60 are cross sectional views of epitaxial wafer 39 during manufacturing according to the seventh embodiment.

First, n-type semiconductor layer 34 of 50 μm in thickness is formed on n-type Si semiconductor substrate 28 in the same manner as in the third embodiment (cf. FIG. 29).

In the same manner as in the third embodiment, 50 trenches 51, 2 μm in width and spaced apart 1 μm from each other, are formed in a region of 150 μm in width in the section, in which edge terminating section 300 will be formed. In this case, trenches 51 are arranged at a pitch of 3 μm. Trenches 51 are 50 μm in depth (FIG. 58). By forming a plurality of narrow trenches 51 as described above, the amounts of reaction products, which are liable to be caused in forming a wide trench, are suppressed.

Since columnar protrusions called "black silicon" are prevented from occurring, a trench etching process that causes less etching defects is obtained with low costs. Generally, black silicon deteriorates the device characteristics. For preventing black silicon from occurring, it is necessary to clean the inside of a chamber in a trench etching apparatus frequently. Therefore, the manufacturing costs soar.

After trenches 51 are formed, thermal oxidation is conducted. Since the silicon columns, comprised of n-type semiconductor layers 34 and positioned between trenches 51, are 1 μm in width, the silicon columns are converted to silicon oxide columns completely by conducting thermal oxidation as thick as 1 μm. As a result, trenches 51 are filled with silicon oxide and oxide region 52, 150 μm in width and 50 μm in depth, is formed in the section, in which edge terminating section 300 will be formed (FIG. 59).

A resist film is coated on the regions excluding oxide region 52 to protect the regions below the resist film. Then, wet etching is conducted with HF to remove oxide region 52. Thus, recess 53 is formed in the same manner as trench 35 in FIG. 30 in the section, in which edge terminating section 300 will be formed (FIG. 60).

Then, by conducting the steps described with reference to FIGS. 31 through 34, epitaxial wafer 39 shown in FIG. 34 is obtained.

Eighth Embodiment

Epitaxial wafer 39 according to the third embodiment is manufactured by a method according to an eighth embodiment of the invention. FIGS. 61 through 64 are cross sectional views of epitaxial wafer 39 during manufacturing according to the eighth embodiment.

First, n-type semiconductor layer 34 of 50 μm in thickness is formed on n-type Si semiconductor substrate 28 in the same manner as in the third embodiment (cf. FIG. 29). The average impurity concentration in n-type semiconductor layer 34 is $2.5 \times 10^{14}$ cm$^{-3}$, for example.

Figure 61:
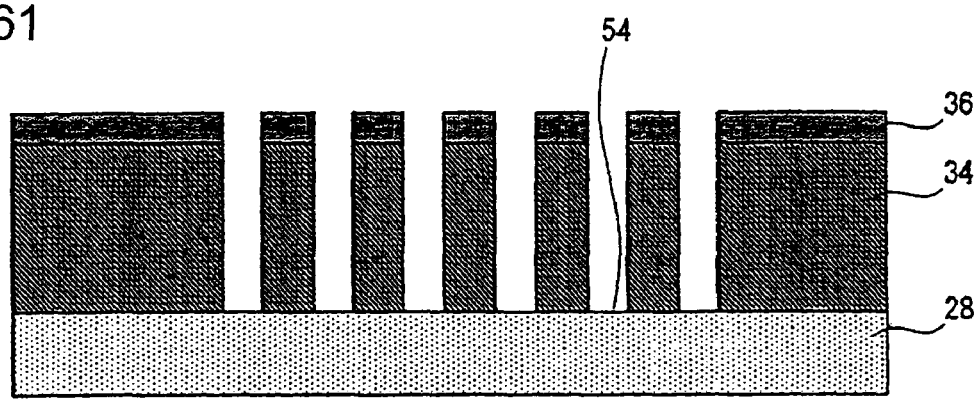
FIG. 61 is a first cross sectional view of an epitaxial wafer during manufacturing by a method according to an eighth embodiment of the invention.

Then, in the same manner as in the third embodiment, 15 trenches 54, 5 μm in width and spaced apart 5 μm from each other, are formed in a region of 150 μm in width in the section, in which edge terminating section 300 will be formed. In this case, trenches 54 are arranged at a pitch of 10 μm. Trenches 54 are 50 μm in depth (FIG. 61).

Figure 62:
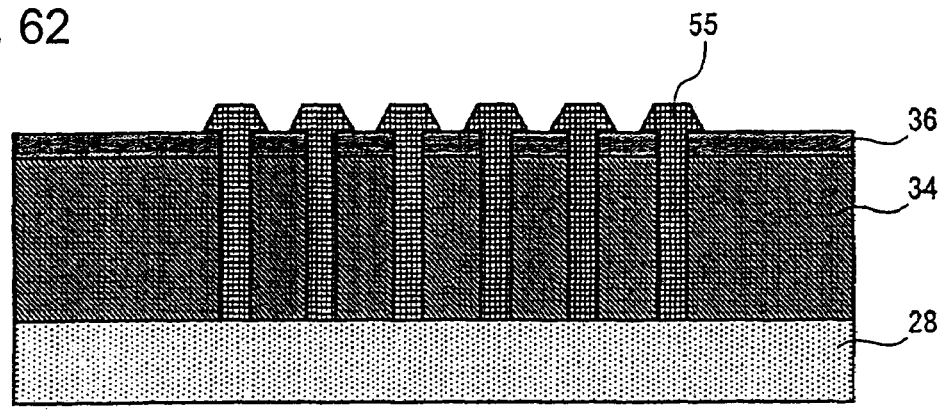
FIG. 62 is a second cross sectional view of the epitaxial wafer during manufacturing by the method according to the eighth embodiment.

P-type semiconductor layer 55 containing $3.5 \times 10^{14}$ cm$^{-3}$ of boron is grown in an epitaxial manner in trenches 54 in the same manner as in the third embodiment (FIG. 62).

Figure 63:
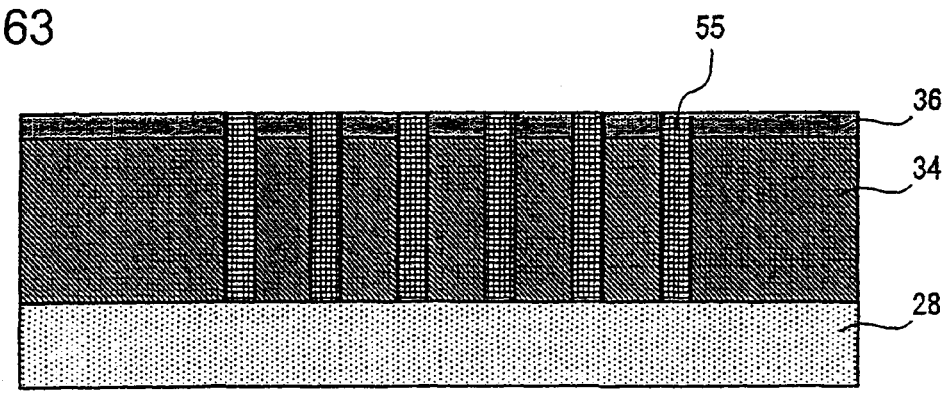
FIG. 63 is a third cross sectional view of the epitaxial wafer during manufacturing by the method according to the eighth embodiment.

The portion of p-type semiconductor layer 55 rising from the surface of mask 36 is planed, for example, by CMP employing the oxide film used for mask 36 in the trench etching for a stopper (FIG. 63). Thermal oxidation may be conducted prior to the CMP.

The p-type impurity (boron in this case) contained in p-type semiconductor layer 55 is diffused by conducting a thermal treatment at 1150° C. for 3 hours.

Figure 64:
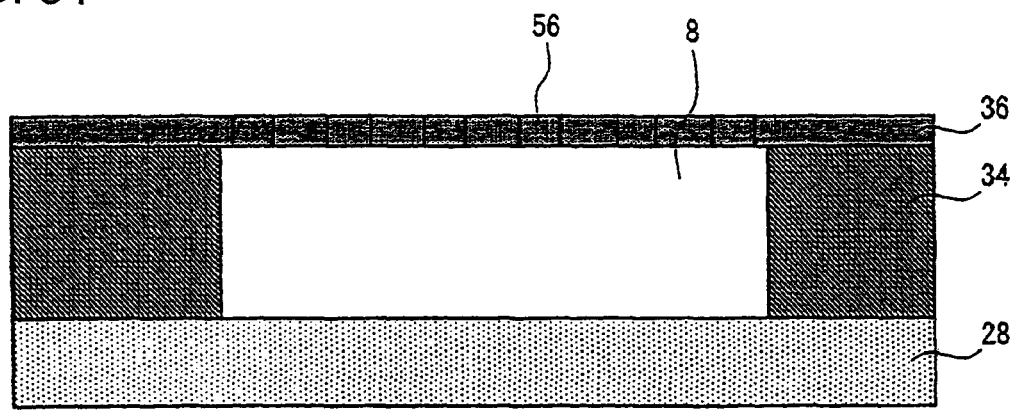
FIG. 64 is a fourth cross sectional view of the epitaxial wafer during manufacturing by the method according to the eighth embodiment.

The thermal treatment conducted under the conditions described above diffuses the p-type impurity for about 3 μm. Therefore, the p-type impurity contained in p-type semiconductor layer 55 diffuses into the silicon columns that remain between the trenches and are comprised of n-type semiconductor layer 34. As a result, p-type partition region 8, 150 μm in width and 50 μm in depth, is formed in the section in which edge terminating section 300 will be formed. The average impurity concentration in p-type partition region 8 is $1.0 \times 10^{14}$ cm$^{-3}$, for example. By the thermal treatment, oxide film 56 of 0.4 μm in thickness is formed on p-type semiconductor layer 55 buried in trench 54 (FIG. 64).

The oxide film used for mask 36 in the trench etching and oxide film 56 formed by the thermal diffusion are removed by wet etching using HF. Thus, epitaxial wafer 39 shown in FIG. 34 is obtained.

The impurity concentrations in n-type semiconductor layer 34 and p-type semiconductor layer 55 are not necessarily limited to the values described above. The impurity concentrations in semiconductor layers 34 and 55 may be set appropriately so that the impurity concentration in p-type partition region 8 in edge terminating section 300 may be $1.0 \times 10^{14}$ cm$^{-3}$ in the final stage of manufacturing a MOSFET using epitaxial wafer 39 manufactured as described above.

Although the p-type impurity is diffused in the step described with reference to FIG. 64 in the manufacturing process described above, the step of p-type impurity diffusion may be omitted. Alternatively, the p-type impurity in p-type semiconductor layer 55 may be diffused in the thermal treatment step in manufacturing a MOSFET device using epitaxial wafer 39 obtained through the manufacturing process described above. In other words, it is a primary target to finally form desirable p-type partition region 8 by adjusting the thermal budget from the stage of manufacturing epitaxial wafer 39 to the stage of completing a MOSFET device.

Now planar patterns of trench 54 formed in the step described with reference to FIG. 61 will be described below.

Figure 65:
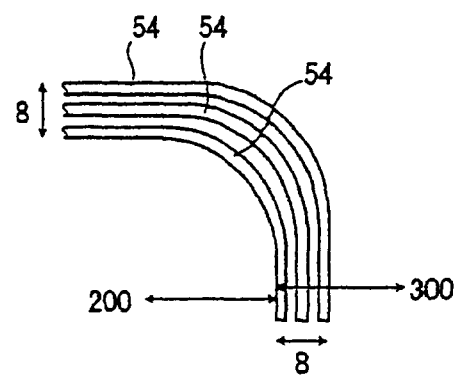
FIG. 65 is an expanded plan view showing the planar pattern of trenches in the corner portion of the edge terminating section.
Figure 66:
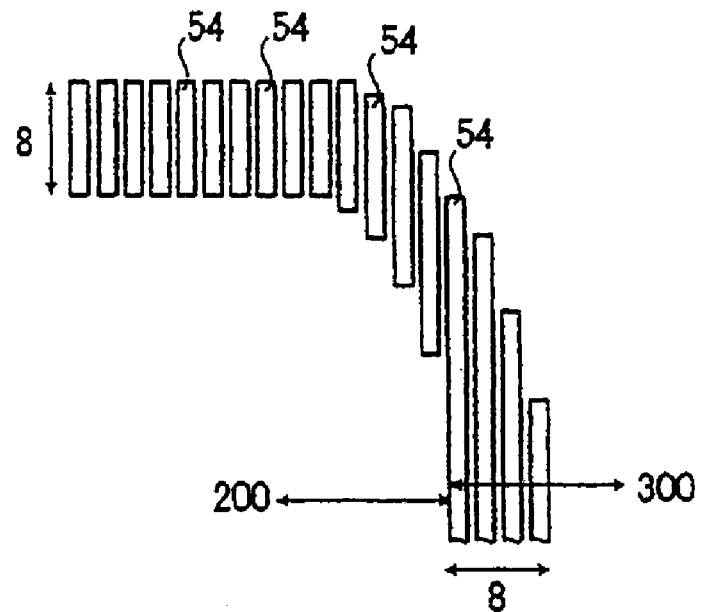
FIG. 66 is another expanded plan view showing the planar pattern of trenches in the corner portion of the edge terminating section.
Figure 67:
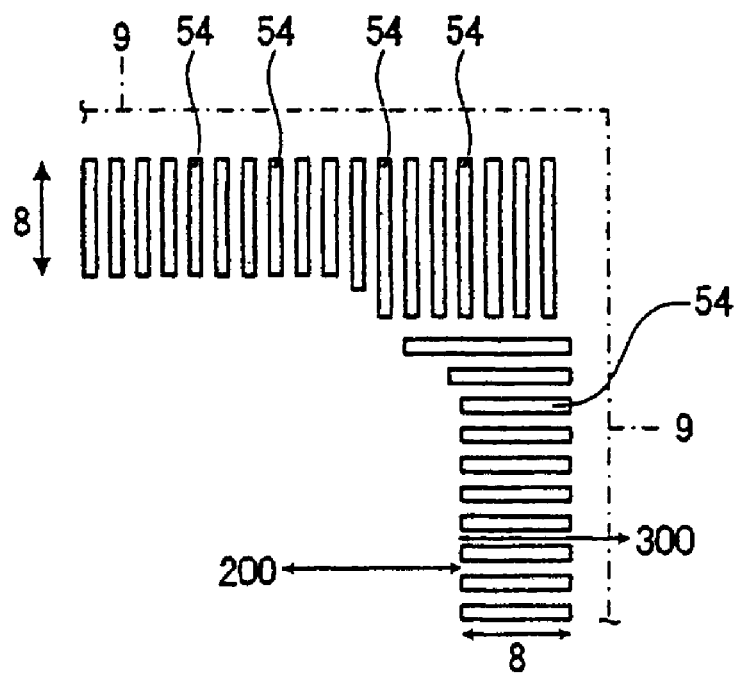
FIG. 67 is still another expanded plan view showing the planar pattern of trenches in the corner portion of the edge terminating section.

In the pattern shown in FIG. 65, adjoining trenches 54 are shaped with parallel arcs bent at 90° in the corner portion of edge terminating section 300. However, when the pattern shown in FIG. 65 is employed, the trench sidewall has a plane orientation, in which the epitaxial growth rate is low, as described in connection with the third embodiment. Therefore, it takes a long time to completely fill trench 54 with p-type semiconductor layer 55. To avoid this problem, it is preferable to employ the patterns shown in FIGS. 66 and 67. In FIGS. 65 through 67, only some trenches out of the fifteen trenches are shown to avoid complicated illustrations.

In the pattern shown in FIG. 66, all trenches 54 are extended in the same direction. The ends of adjoining trenches 54 are displaced little by little in the corner portion of edge terminating section 300 such that the region, in which trenches 54 are bunched, is bent like an arc at 90° in the corner portion of edge terminating section 300.

In the pattern shown in FIG. 67, trenches 54 are extended at 90° with scribe planes 9 (shown by a single-dotted chain lines in FIG. 67) of the semiconductor device. In the corner portion of edge terminating section 300, trenches 54 are extended at 90° with either one of adjacent scribe planes 9.

When the pattern shown in FIG. 66 or 67 is employed, it is possible to fill trench 54 with p-type semiconductor layer 55 in a short time, since the trench side wall has the plane orientation in which the epitaxial growth rate is high. The pattern shown in FIG. 67 facilitates obtaining an ideal edge terminating structure that hardly causes electric field localization, even when n-type semiconductor layer 34, which will be an n-type drift region, remains in edge terminating section 300 due to the difficulty in conducting a high-temperature thermal treatment.

It is effective to form trenches 54, 7 μm in width and spaced apart at 5 μm, in the step described with reference to FIG. 61 and to equalize the average impurity concentration in n-type semiconductor layer 34 remaining between trenches 54 and the average impurity concentration in p-type semiconductor layer 55 filling trench 54 in the step described with reference to FIG. 62 to each other. The equal average impurity concentrations in n-type semiconductor layer 34 and p-type semiconductor layer 55 facilitate obtaining an ideal edge terminating structure that hardly causes electric field localization in the same manner as the manufacturing process described above.

Ninth Embodiment

Epitaxial wafer 39 according to the third embodiment is manufactured also by a method according to a ninth embodiment of the invention. FIGS. 68 through 73 are cross sectional views of epitaxial wafer 39 during manufacturing according to the ninth embodiment.

Figure 68:
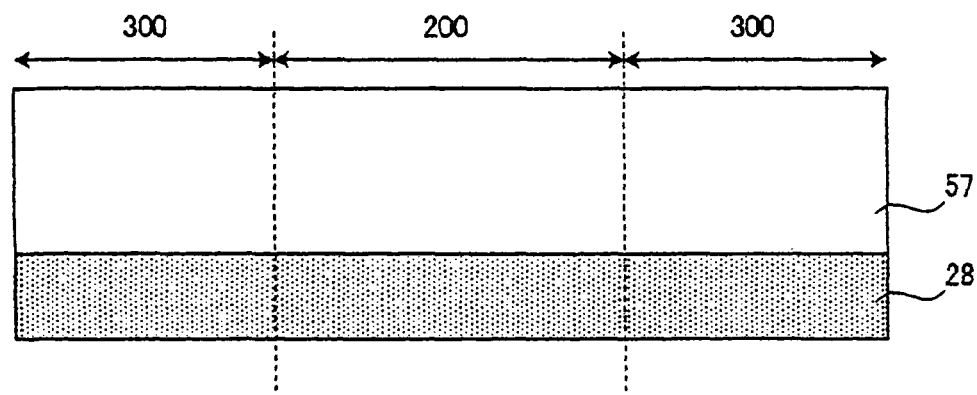
FIG. 68 is a first cross sectional view of an epitaxial wafer during manufacturing by a method according to a ninth embodiment of the invention.

First, p-type semiconductor layer 57, containing $1.0 \times 10^{14}$ cm$^{-3}$ of boron, is grown to 50 μm in thickness on n-type Si semiconductor substrate 28 containing $2.0 \times 10^{18}$ cm$^{-3}$ of antimony (FIG. 68).

Figure 69:
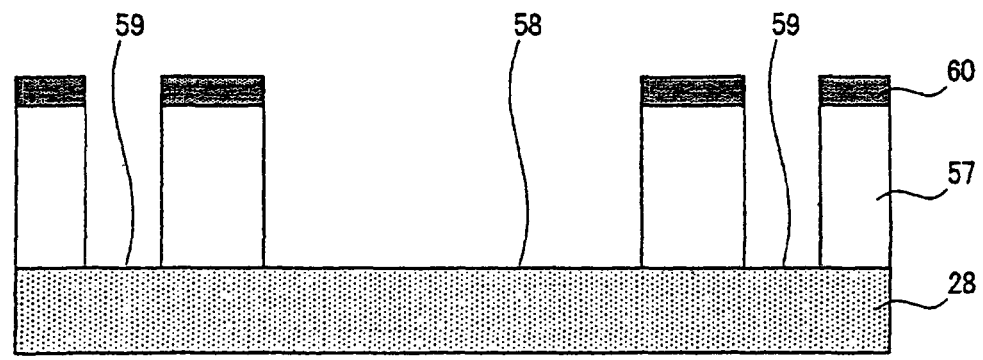
FIG. 69 is a second cross sectional view of the epitaxial wafer during manufacturing by the method according to the ninth embodiment.

Trench 58 is formed in the section of p-type semiconductor layer 57 which will be active section 200 and trench 59 is formed in the section of p-type semiconductor layer 57 which will be in contact with scribe plane 9, in the same manner as in the third embodiment (FIG. 69).

Trench 58 in the section of p-type semiconductor layer 57 which will be active section 200 is 3 mm in the first and second widths perpendicular to each other and 50 μm in depth. Trenches 59 in the section of p-type semiconductor layer 57 which will be in contact with scribe plane 9 is 20 μm or more in width and 50 μm in depth.

In conducting trench etching, an oxide film is used for mask 60. The bottoms of trenches 58 and 59 may be positioned 10 μm above or below the boundary between n-type Si semiconductor substrate 28 and p-type semiconductor layer 57.

Figure 70:
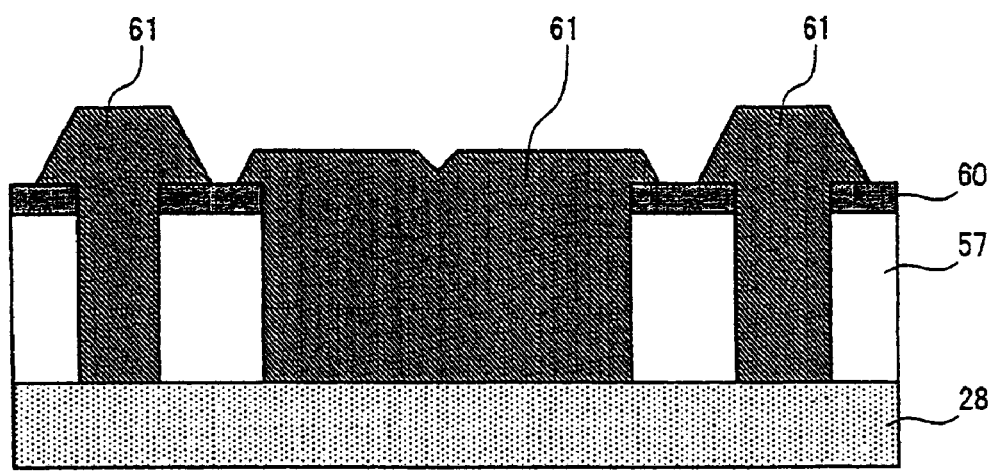
FIG. 70 is a third cross sectional view of the epitaxial wafer during manufacturing by the method according to the ninth embodiment.

Then, n-type semiconductor layers 61 containing $2.5 \times 10^{14}$ cm$^{-3}$ of phosphorus or arsenic are grown in an epitaxial manner in trenches 58 and 59 in the same manner as in the third embodiment (FIG. 70).

Figure 71:
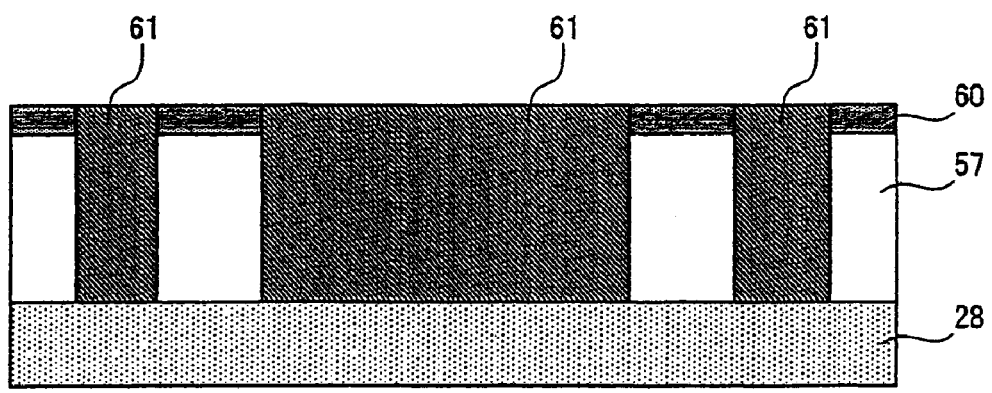
FIG. 71 is a fourth cross sectional view of the epitaxial wafer during manufacturing by the method according to the ninth embodiment.

The portions of n-type semiconductor layers 61 rising from the surface of mask 60 are planed, for example, by CMP employing the oxide film used for mask 60 in the trench etching for a stopper in the same manner as in the third embodiment (FIG. 71). Thermal oxidation may be conducted prior to the CMP.

Figure 72:
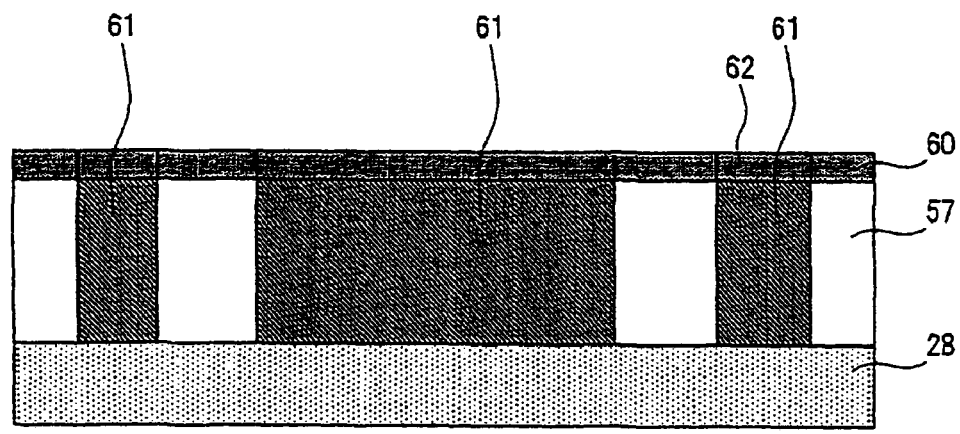
FIG. 72 is a fifth cross sectional view of the epitaxial wafer during manufacturing by the method according to the ninth embodiment.

Oxide film 62 having a uniform thickness is formed on the entire surfaces of n-type semiconductor layer 61 and the oxide film used for mask 60 by thermal oxidation in the same manner as in the third embodiment (FIG. 72). By removing oxide film 62 in the same manner as in the third embodiment, a flat surface having no step is obtained.

Figure 73:
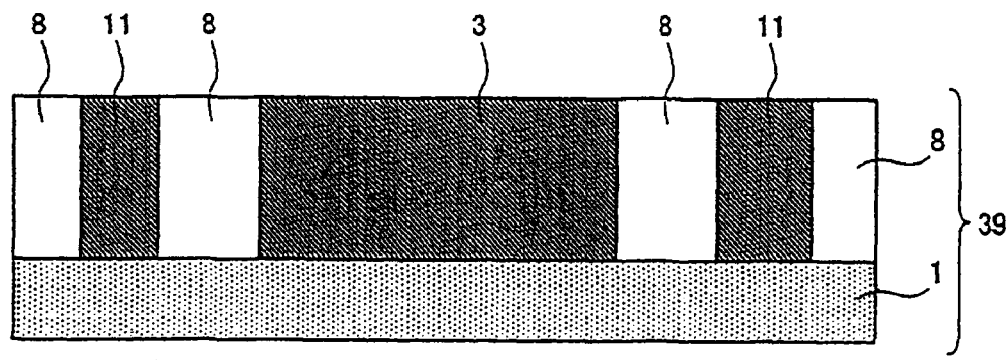
FIG. 73 is a sixth cross sectional view of the epitaxial wafer during manufacturing by the method according to the ninth embodiment.

Thus, epitaxial wafer 39 including n-type semiconductor substrate layer 1, n-type drift layer 3 on substrate layer 1, n-type pillar region 11 on substrate layer 1, and p-type partition region 8 on substrate layer 1 is obtained (FIGS. 73 and 34).

Figure 74:
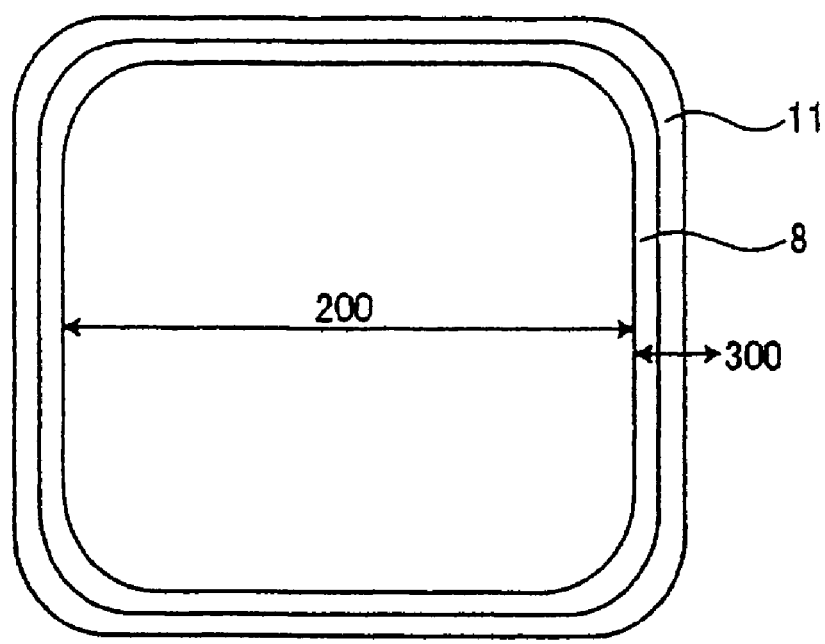
FIG. 74 is a top plan view showing the planar patterns of the semiconductor regions in the edge terminating section.

FIG. 74 is a top plan view showing the planar patterns of the semiconductor regions (the p-type partition region and n-type pillar region) in the edge terminating section. As shown in FIG. 74, p-type partition region 8 in edge terminating section 300 is arranged such that p-type partition region 8 surrounds active section 200. When the corner portion width of p-type partition region 8 is 150 μm, the same as the straight portion width, an ideal edge terminating structure that hardly causes electric field localization is obtained. When n-type pillar region 11 is 20 μm or more in width, n-type pillar region 11 is advantageous for a depletion layer stopper. It is also advantageous to further widen n-type pillar region 11 such that n-type pillar region 11 is in contact with scribed plane 9, i.e., the scribe line, of the semiconductor chip.

In manufacturing the epitaxial wafer according to the seventh embodiment, an n-type drift region and an n-type pillar region may be formed with no problem in the same manner as in the ninth embodiment through the step of growing a p-type semiconductor layer on an n-type Si semiconductor substrate in an epitaxial manner, the step of forming narrow trenches in the p-type epitaxial growth layer, the step of forming oxide regions by thermal oxidation, the step of removing the oxide regions, whereby to form recesses, and the step of growing in an epitaxial manner an n-type semiconductor in the recesses formed by removing the oxide regions.

In manufacturing the epitaxial wafer according to the eighth embodiment, an n-type drift region and an n-type pillar region may be formed with no problem in the same manner as in the ninth embodiment through the step of growing a p-type semiconductor layer on an n-type Si semiconductor substrate in an epitaxial manner, the step of forming narrow trenches in the p-type epitaxial growth layer, the step of conducting epitaxial growth to fill the trenches with an n-type semiconductor, and the step of diffusing the n-type impurity.

Although the invention has been described so far in connection with the first through ninth embodiments, changes and modifications are obvious to the ordinary skilled person in the art without departing from the spirit and scope of the invention.

For example, active section 200 in the semiconductor devices according to the first through ninth embodiments is comprised of an n-type semiconductor layer or a super-junction layer including n-type drift regions and p-type partition regions. If described broadly, any combination may exhibit the same advantages as far as the conductivity type of the partition region in edge terminating section 300 is opposite to the conductivity type of the drift region in active section 200. A conventional field-limiting ring structure, a combination of a field-limiting ring structure and a field plate structure, and a RESURF structure may be used for the edge terminating structure in substitution for the multilevel field plate structure according to the invention. The alternative edge terminating structures are advantageous in the same manner as the multilevel field plate structure according to the invention.

The semiconductor device in the active section is not limited to a MOSFET. An IGBT or a diode may be formed in the active section with no problem. The dimensions, concentrations, temperatures, pressures, periods of time, rotation rates, and such parameters according to the first through ninth embodiments are examples. The invention is applicable to the semiconductor devices, in which the first conductivity type is a p-type and the second conductivity is an n-type.

The semiconductor devices and the manufacturing method according to the invention are useful for power conversion apparatuses and for manufacturing the power conversion apparatuses.

Thus, semiconductor devices and methods for their manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device that comprises a semiconductor chip and has a current flow in a thickness direction of the semiconductor chip, the semiconductor device comprising:
an active section comprising a base region of a second conductivity type formed selectively on a first major surface side of the semiconductor chip, a semiconductor substrate layer of a first conductivity type, of which a first major surface side is on a second major surface side of the semiconductor chip, and a drift layer between the semiconductor substrate layer and the base region;
a first main electrode connected electrically to the base region;
a pillar region of a first conductivity type formed along a scribe plane of the semiconductor chip;
an edge terminating section surrounding the active section and on the first major surface side of the semiconductor substrate layer, the edge terminating section consisting essentially of a first semiconductor region of the second conductivity type formed between the active section and the pillar region; and
a second main electrode connected electrically to a second major surface side of the semiconductor substrate layer.

2. The semiconductor device according to claim 1, wherein the drift layer comprises (i) a drift region of the first conductivity type or (ii) an alternating conductivity type layer comprising drift regions of the first conductivity type and partition regions of the second conductivity type arranged alternately.

3. The semiconductor device according to claim 1, wherein a junction boundary plane between the first semiconductor region and the drift layer slants toward major surfaces of the first semiconductor region and the drift layer.

4. The semiconductor device according to claim 1, the semiconductor device further comprising an insulator layer between the first semiconductor region and the semiconductor substrate layer.

5. The semiconductor device according to claim 1, wherein the first semiconductor region is in contact with the base region.

6. The semiconductor device according to claim 5, wherein a projection length $W_{Projection}$ of the base region projecting to the first semiconductor region is related with a thickness t of the first semiconductor region by a following relational expression $$W_{Projection} > 0.2 \times t.$$

7. The semiconductor device according to claim 6, wherein the projection length $W_{Projection}$ of the base region is related with the thickness t of the first semiconductor region by a following relational expression $$W_{Projection} > 0.4 \times t.$$

8. The semiconductor device according to claim 1, the semiconductor device further comprising a channel stopper region disposed in a surface portion of the first semiconductor region on a side of the scribe plane of the semiconductor chip.

9. The semiconductor device according to claim 8, wherein the pillar region and the channel stopper region are in contact with each other.

10. The semiconductor device according to claim 1, the semiconductor device further comprising a field plate structure in contact with the base region, and the field plate structure extending onto an insulator film covering a part of the first semiconductor region.

11. The semiconductor device according to claim 1, wherein a thickness t and a concentration $N_2$ of the first semiconductor region are related with each other by a following relational expression using a unit charge q, a dielectric permeability of silicon $\in_{si}$, and a critical electric field strength $E_{Critical}$ of a semiconductor $$N_2 < \in_{Si} \times E_{Critical}/(q \times t).$$

12. The semiconductor device according to claim 11, wherein the thickness t and the concentration $N_2$ of the first semiconductor region are related with each other by a following relational expression $$N_2 < 0.8 \times \in_{Si} \times E_{Critical}/(q \times t).$$

13. The semiconductor device according to claim 1, the semiconductor device comprising a diode, a MOSFET, or an IGBT.

14. A method of manufacturing a semiconductor device as claimed in claim 1, comprising:
etching a semiconductor wafer to form trenches in the semiconductor wafer;
thermally oxidizing portions of the semiconductor wafer remaining between the trenches to form oxide films;
removing the oxide films formed by the thermal oxidation; and
filling portions from which the oxide films have been removed with an epitaxial layer of the second conductivity type to form the first semiconductor region.

15. The method according to claim 14, further comprising:
conducting thermal oxidation after the step of filling with an epitaxial layer; and
polishing a surface of the semiconductor wafer after the step of conducting thermal oxidation.

16. A method of manufacturing a semiconductor device as claimed in claim 1, comprising:
etching a semiconductor wafer to form trenches in the semiconductor wafer;
filling the trenches with an epitaxial layer of the second conductivity type; and
diffusing an impurity of the second conductivity type between the trenches to form the first semiconductor region.

17. The method according to claim 16, further comprising:
conducting thermal oxidation after the step of filling with an epitaxial layer; and
polishing a surface of the semiconductor wafer after the step of conducting thermal oxidation.

18. A method of manufacturing a semiconductor device as claimed in claim 1, comprising:
etching a semiconductor wafer by anisotropic wet etching to form a trench in the semiconductor wafer; and
filling the trench with an epitaxial layer of the second conductivity type to form the first semiconductor region.

19. The method according to claim 18, further comprising:
conducting thermal oxidation after the step of filling with an epitaxial layer; and
polishing a surface of the semiconductor wafer after the step of conducting thermal oxidation.

* * * * *